United States Patent
Takata

(10) Patent No.: US 6,590,912 B2
(45) Date of Patent: Jul. 8, 2003

(54) SEMICONDUCTOR LASER DRIVING APPARATUS AND METHOD AND IMAGE-FORMING APPARATUS

(75) Inventor: Takuya Takata, Kanagawa (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 104 days.

(21) Appl. No.: 09/791,746

(22) Filed: Feb. 26, 2001

(65) Prior Publication Data

US 2001/0017869 A1 Aug. 30, 2001

(30) Foreign Application Priority Data

Feb. 25, 2000 (JP) ........................................ 2000-050095

(51) Int. Cl.$^7$ ................................................ H01S 3/13
(52) U.S. Cl. ................................ 372/29.02; 372/29.01; 372/29.011
(58) Field of Search .................. 372/29.014–29.02, 372/29.01, 29.011, 38.01, 38.02, 38.07

(56) References Cited

U.S. PATENT DOCUMENTS

| | | | | |
|---|---|---|---|---|
| 4,834,477 A | * | 5/1989 | Tomita et al. | 359/17 |
| 5,548,666 A | * | 8/1996 | Yoneda et al. | 382/276 |
| 5,801,813 A | * | 9/1998 | Morimoto et al. | 355/27 |
| 6,266,498 B1 | * | 7/2001 | Oda et al. | 347/138 |
| 6,392,684 B1 | * | 5/2002 | Tanimoto et al. | 347/234 |

FOREIGN PATENT DOCUMENTS

| | | | | |
|---|---|---|---|---|
| JP | 61-133685 | * | 6/1986 | H01S/3/103 |
| JP | 61-133686 | * | 6/1986 | H01S/3/103 |
| JP | 61-133687 | * | 6/1986 | H01S/3/103 |
| JP | 61-133688 | * | 6/1986 | H01S/3/103 |
| JP | 61-260691 | * | 11/1986 | H01S/3/133 |
| JP | 61-260693 | * | 11/1986 | H01S/3/133 |
| JP | 61-264773 | * | 11/1986 | H01S/3/133 |
| JP | 61-264774 | * | 11/1986 | H01S/3/133 |
| JP | 62-028708 | * | 2/1987 | G02B/26/17 |
| JP | 64-024485 | * | 1/1989 | H01S/3/18 |
| JP | 01-236386 | * | 9/1989 | G06K/7/70 |
| JP | 01-236387 | * | 9/1989 | G06K/7/10 |
| JP | 06-054133 | * | 2/1994 | H04N/1/04 |
| JP | 07-325278 | * | 12/1995 | G02F/1/11 |

* cited by examiner

Primary Examiner—Paul Ip
Assistant Examiner—Tuan Nguyen
(74) Attorney, Agent, or Firm—Sughrue Mion, PLLC

(57) ABSTRACT

A compact, low-cost semiconductor laser driving apparatus which can assuredly prevent the influence of mode-hopping noise, a semiconductor laser driving method and an image forming apparatus are provided. Automatic Temperature Control and Automatic Power Control are performed and then the temperature of a laser diode (LD) is raised in small increments (0.1° C.). At each temperature level, the LD is driven in accordance with predetermined image data and an LD light amount is detected for each of a predetermined number of image lines. When the proportion of these line light amounts that are outside a range of tolerance is less than a predetermined proportion (5%) for a predetermined number of consecutive temperature levels, the temperature is stored to serve as a control temperature of the LD during actual optical scanning. This process is performed for all LDs.

10 Claims, 14 Drawing Sheets

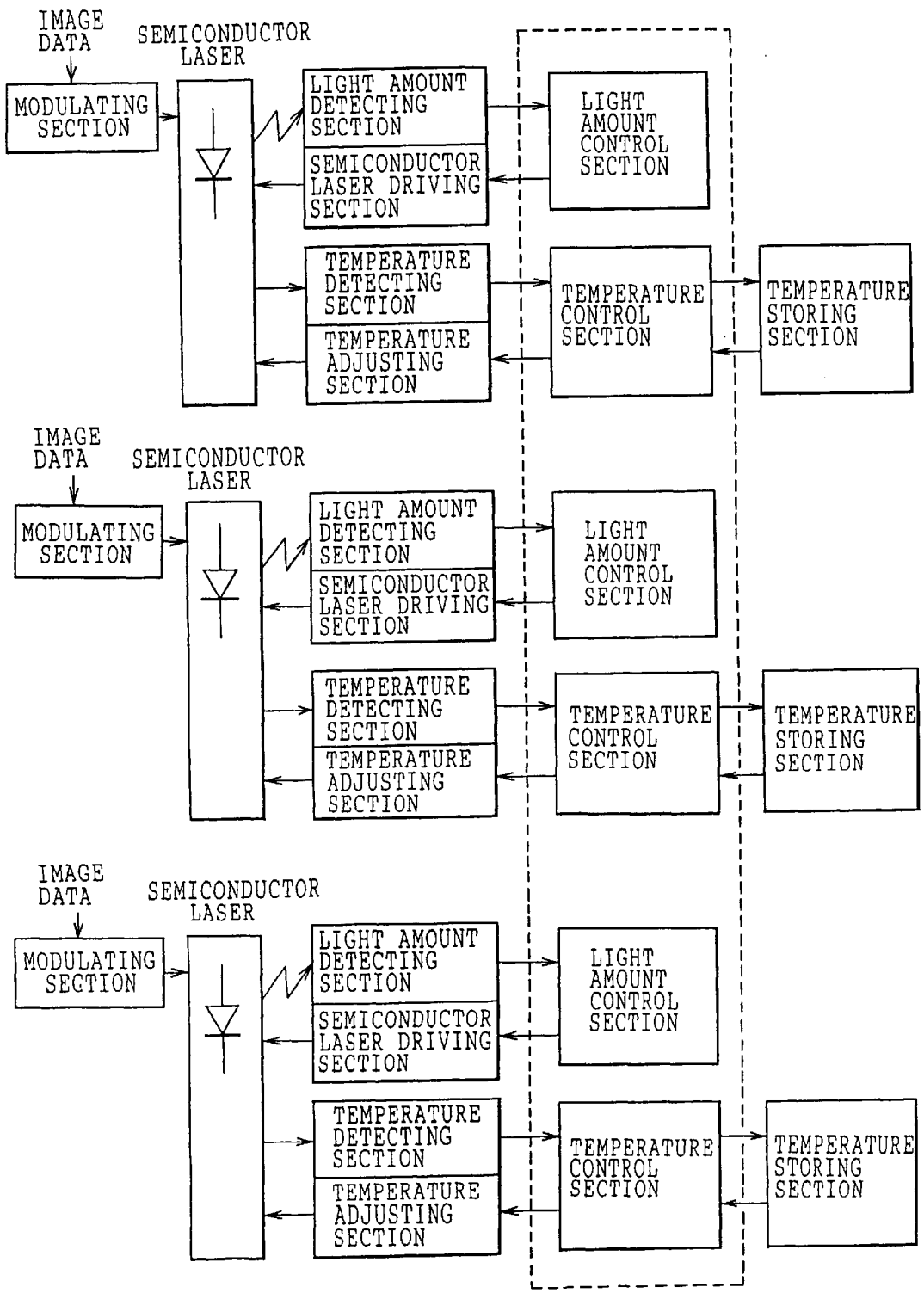

SEMICONDUCTOR LASER DRIVING APPARATUS AND METHOD AND IMAGE-FORMING APPARATUS

BACKGROUND OF THE INVENTION

1. Field of the Invention

The present invention relates to a semiconductor laser driving apparatus, a semiconductor laser driving method, and an image-forming apparatus, particularly to a semiconductor laser driving apparatus, semiconductor laser driving method, and image-forming apparatus capable of preventing mode-hopping noise from being generated by a semiconductor laser.

2. Related Art

Optical scanning for recording various pieces of information including image information by scanning a recording medium with an optical beam or for reading various pieces of information from a recording medium uses a laser beam emitted from a semiconductor laser as an optical beam for scanning.

FIG. 14 shows functional blocks of a conventional semiconductor laser driving apparatus used to perform optical scanning with a laser beam emitted from a semiconductor laser. As shown in FIG. 14, the semiconductor laser driving apparatus is provided with semiconductor lasers of three types, for emitting laser beams having wavelengths different from each other, and the laser beam emitted from each semiconductor laser is modulated by a modulating section in accordance with image data.

Moreover, in this semiconductor laser driving apparatus, the light amount of a laser beam emitted from each semiconductor laser is detected by a light amount detecting section and a semiconductor laser driving section is controlled for APC (Auto Power Control) by a light amount control section so that the detected light amount becomes equal to a predetermined target light amount.

Furthermore, in this semiconductor laser driving apparatus, similarly to the aforementioned APC, the temperature at or near a light-emitting section of each semiconductor laser (hereafter referred to as semiconductor laser temperature) is detected by a temperature detecting section, and a temperature adjusting section is controlled by a temperature control section for ATC (Auto Temperature Control) so that the detected temperature becomes equal to a previously stored setting temperature (control temperature).

When performing optical scanning by a laser beam emitted from a semiconductor laser, it is generally required that a maximum fluctuation of the light amount of the laser beam is kept at approximately 1% or less when the optical scanning administers, for example, continuous gradation image information. That is, if the maximum fluctuation exceeds approximately 1%, visible irregularities occur in a recorded image or in an image formed from image information read by scanning.

However, mode-hopping noise may be generated in the semiconductor laser, depending on driving conditions. That is, different modes (laser wavelengths) compete with each other in the semiconductor laser under certain driving conditions, mode-hopping from one to another of the different modes, and from the other to the one, is reciprocatingly repeated, and the light amount of the laser beam fluctuates due to the repeted mode-hopping. That is, mode-hopping noise is generated.

The fluctuation of a light amount due to the mode-hopping noise reaches several percent of total light amount. Therefore, when mode-hopping noise is generated during optical scanning for administering continuous gradation image information, extreme irregularities occur in the recorded image or the image formed from read image information. Moreover, mode-hopping noise fluctuates not only light amounts but also wavelength, which may affect images.

Therefore, to drive a semiconductor laser for optical scanning for handling continuous gradation image information, it is necessary to drive the semiconductor laser such that mode-hopping noise is not generated. By preventing mode-hopping noise, neither light amount nor wavelength fluctuate and a preferable image can be obtained.

Techniques for preventing mode-hopping noise from being generated are disclosed in Japanese Patent Application Laid-Open (JP-A) Nos. 61-260691, 61-260693, 61-264773, and 61-264774.

Each of the techniques disclosed in JP-A Nos. 61-260691 and 61-260693 stabilizes the wavelength of a laser beam to a single longitudinal mode by superimposing on a driving signal to be applied to a semiconductor laser high-frequency pulses having a frequency higher than that of the driving signal and adjusting at least one of parameters such as frequency, duty ratio, and amplitude of the high-frequency pulses, such as frequency, duty ratio, and amplitude. Thus, it is possible to prevent mode-hopping noise from being generated.

Further, a technique disclosed in JP-A No. 61-264773 uses a detector for detecting mode-hopping noise to change either or both of a setting light amount and a setting temperature when mode-hopping noise is detected by the detector.

Furthermore, a technique disclosed in JP-A No. 61-264774 measures and stores a temperature region in which mode-hopping noise is generated in advance, and controls a combination of light amount and temperature of a semiconductor laser such that the combination does not move to that temperature region. Thus, it is possible to prevent mode-hopping noise in advance.

However, in the case of the techniques disclosed in the above JP-A Nos. 61-260691 and 61-260693, it is necessary to superimpose high-frequency pulses on the semiconductor laser driving signal as described above. Therefore, there is a problem that cannot be prevented in that the apparatus is increased in size because hardware and control are complicated, and cost increases. Moreover, these techniques have a problem in that image quality is deteriorated because superimposed high-frequency pulses may function as noise when forming an image.

Moreover, the technique disclosed in JP-A No. 61-264773 has a problem in that it is impossible to completely prevent mode-hopping noise from being generated because generation of mode-hopping noise is detected by a detector and thereafter one or both of the setting light amount and the setting temperature is changed and thus, mode-hopping noise is continuously generated until the change is completed. Moreover, this technique requires a detector for detecting mode-hopping noise and thus, there is a problem in that cost increases.

Moreover, the technique disclosed in JP-A No. 61-264774 has a problem in that it is impossible to absorb shifts to temperatures at which mode-hopping noise is generated, due to various conditions of actual optical scanning (such as laser-beam emission cycle and emission start timing of the semiconductor laser) because temperatures at which mode-hopping noise is generated are not measured in conditions of actual optical scanning, and it is impossible to completely prevent the generation of mode-hopping noise. Moreover, because the technique requires a special apparatus for measuring temperatures at which mode-hopping noise is generated, there is a problem in that cost increases.

SUMMARY OF THE INVENTION

The present invention is provided to solve the above problems and an object of the present invention is to provide a semiconductor laser driving apparatus and a semiconductor laser driving method which can be made compact and fabricated at low cost and which make it possible to assuredly prevent the influence of mode-hopping noise and, moreover, to provide an image-forming apparatus capable of forming a high-quality image.

To achieve the above object, a first aspect of the present invention is a semiconductor laser driving apparatus that drives a semiconductor laser that emits laser light for optical scanning, the apparatus including a light amount detecting section which detects a light amount of a laser light emitted from the semiconductor laser, a temperature detecting section which detects a laser section temperature, which is one of a temperature of a light-emitting section of the semiconductor laser and a temperature of a vicinity of the semiconductor laser, a temperature adjusting section which adjusts the laser section temperature, a light amount control section which, while the semiconductor laser is driven in a manner the same as for actual optical scanning, controls driving of the semiconductor laser such that a light amount detected by the light amount detecting section becomes equal to a predetermined target light amount, and a temperature deciding section that, while control is performed by the light amount control section, causes the laser section temperature to be altered by the temperature adjusting section, and, if a light amount detected by the light amount detecting section is within a predetermined error span, decides on the laser section temperature as a setting temperature for optical scanning of the semiconductor laser. The light amount detecting section includes all photoelectric-conversion devices such as a photodiode or phototransistor and the temperature detecting section includes all temperature sensors such as a thermistor or thermocouple. Moreover, the temperature adjusting section includes all devices capable of performing at least one of temperature rise and temperature reduction, such as a power transistor, fan, or Peltier device.

Moreover, according to the first aspect of the present invention, driving of the semiconductor laser is controlled such that the light amount detected by the light amount detecting section becomes equal to a predetermined target light amount, while the semiconductor laser is driven by a light amount control section in the same manner as for actual optical scanning. That is, APC is performed while the semiconductor laser is driven by the light amount control section in the same manner as for actual optical scanning.

Furthermore, in the first aspect of the present invention, while control is performed by the light amount control (that is, while APC is performed), the temperature of the light-emitting section of the semiconductor laser or the temperature near the semiconductor laser is changed by the temperature adjusting section. When a light amount changes detected by the light amount detecting section are kept within a predetermined error span, the temperature of the light-emitting section of the semiconductor laser or the temperature near the semiconductor laser is decided on as a setting temperature for optical scanning by the semiconductor laser. The above error span can be, for example, a range outside which visible irregularities occur in a recorded image or image formed from read image information (for example, s range of error from a target light amount from −0.5% up to +0.5%). It is also possible to use an optional range other than the above range, in accordance with required image quality or apparatus specifications.

Thus, the semiconductor laser driving apparatus of the first aspect of the present invention, while driving the semiconductor laser in the same manner as for actual optical scanning, controls driving of the semiconductor laser such that the light amount of laser light emitted from the semiconductor laser becomes equal to the predetermined target light amount, changes the temperature of the light-emitting section of the semiconductor laser or the temperature near the semiconductor laser and thus decides on the temperature of the light-emitting section of the semiconductor laser or the temperature near the semiconductor laser when the above light amount changes are kept within the predetermined error span as the setting temperature of the semiconductor laser under optical scanning. Therefore, it is possible to determine the setting temperature under the same conditions as for actual optical scanning and assuredly prevent the influence of mode-hopping noise, and moreover it is possible to perform the above control and decide the above setting temperature using various combinations of devices for performing APC and ATC that are conventionally provided for a semiconductor laser driving apparatus. Therefore, the apparatus is not increased in size and cost is not increased.

A semiconductor laser driving apparatus of a second aspect of the present invention is the first aspect in which, in a case in which the optical scanning is optical scanning for forming an image on the basis of optical data, while the semiconductor laser is driven such that an image can be formed in accordance with predetermined image data, the light amount control section controls the light amount of the semiconductor laser such that the light amount becomes equal to the target light amount, and the temperature deciding section causes the laser section temperature to be altered, and decides, as the setting temperature for the optical scanning of the semiconductor laser, a laser section temperature level at which an error proportion is at most a predetermined proportion, the error proportion being a ratio of a number of image line light amounts, among a plurality of image line light amounts which are detected by the light amount detecting section at each temperature level, that are outside the predetermined error span, to a total number of lines.

According to second aspect of the present invention, when the optical scanning in the first aspect is optical scanning for forming an image in accordance with image data, the light amount of the semiconductor laser is controlled by the light amount control section so as to become equal to the target light amount, while the semiconductor laser is driven so as to be able to form an image in accordance with the predetermined image data. The above predetermined image data can use image data actually used for optical scanning, image data representative of data likely to be used for optical scanning, average image data likely to be used for optical scanning, gray image data for when the semiconductor laser driving apparatus will administrate color images, or the like.

Moreover, in the second aspect of the present invention, the temperature of the light-emitting section of the semiconductor laser or the temperature near the semiconductor laser is changed by the temperature deciding section, and the setting temperature is the temperature of the semiconductor laser or near the semiconductor laser at which the proportion, with respect to the total number of lines, of line light amounts that are outside the predetermined error span is equal to or less than the predetermined proportion. The above predetermined proportion can use, for example, a proportion at which visible irregularities occur in a formed image when that proportion is. However, it is also possible to use any proportion in accordance with required image quality or apparatus specifications besides the above proportion.

Thus, according to the second aspect of the present invention, it is possible to obtain the same advantages as the first aspect of the present invention. Moreover, when the optical scanning is optical scanning for forming an image in accordance with image data, the semiconductor laser is controlled such that the light amount of the semiconductor laser becomes equal to the target light amount while the semiconductor laser is driven so as to be able to form an image in accordance with predetermined image data, the temperature of the light-emitting section of the semiconductor laser or the temperature near the semiconductor laser is changed, and the temperature of the light-emitting section of the semiconductor laser near the semiconductor laser is set as the setting temperature for the optical scanning by the semiconductor laser when the ratio of the number of line light amounts outside the predetermined error span to the total number of lines is equal to or less than a predetermined ratio, for a plurality of light amounts of image lines detected at each different temperature. Therefore, compared to the case in which the setting temperature is decided in accordance with a light amount change, it is possible to decide on a setting temperature conforming to more realistic conditions for forming an image with high accuracy.

Automatic temperature control (ATC) is not generally performed with direct detection of the temperature of the light-emitting section of a semiconductor laser, but the temperature near the semiconductor laser is detected by a temperature detecting section such as a thermistor. Therefore, an error may occur between the temperature detected by the temperature detecting section and the temperature of the semiconductor laser, due to a change of ambient temperature of the semiconductor laser. Thus, an error or hunting (fluctuation) or the like may occur in control accuracy of ATC.

Therefore, to more assuredly prevent the influence of mode-hopping noise, it is preferable to determine as the above setting temperature a temperature in a temperature range of the light-emitting section of the semiconductor laser or near the semiconductor laser which temperature range is wider than a predetermined range, over which temperature range the ratio to the total number of lines of the number of light amounts out of the predetermined error span is equal to or less than the predetermined ratio. The above predetermined range may be, for example, a range of ±0.5° C. from a certain temperature, that is, a range of 1° C.

Moreover, in a third aspect of the present invention, it is preferable that in the second aspect of the present invention, when a range of the laser section temperature, in which range the error proportion is at most the predetermined proportion, is broader than a predetermined range, the temperature deciding section decides on one of a temperature at a middle of the range and a temperature near the middle of the range as the setting temperature. That is, as a specific example, when the ratio of the number of line light amounts out of the predetermined error span to the total number of lines is equal to or less than the predetermined ratio for a range of 35° C. to 37° C., the setting temperature is set to the central temperature of 36° C. Thus, it is possible to perform high-accuracy ATC which is not easily influenced by the aforementioned errors or an environmental change or the like.

Furthermore, in a fourth aspect of the present invention, it is allowed that, the temperature deciding section decides, as the setting temperature, a laser section temperature level at which the error proportion is at most the predetermined proportion, the laser section temperature level differing from another laser section temperature level, at which the error proportion is more than the predetermined proportion, by more than a predetermined temperature difference. That is, as a specific example, if temperatures at which the ratio of the number of line light amounts outside the predetermined error span to the total number of lines is larger than a predetermined rate are 34° C. and 38° C., it is preferable to use as the setting temperature a temperature separate from these temperatures by a predetermined temperature difference such as 1° C. or more; that is, any temperature in the range from 35° C. to 37° C.

When applying the semiconductor laser driving apparatus of the present invention in an image-forming apparatus for forming an image on a photosensitive material with a laser beam emitted from a semiconductor laser, a preferable light amount to be emitted from the semiconductor laser differs for each type of photosensitive material, because sensitivity of a photosensitive material depends on type. Therefore, if the image-forming apparatus can use a plurality of types of photosensitive material, it is possible to form a high-quality image irrespective of the type of photosensitive material, by changing the target light amount in accordance with the type of photosensitive material.

To correspond to the above case, a semiconductor laser driving apparatus of a fifth aspect of the present invention performs the control by the light amount control section and the decision of the setting temperature by the temperature deciding section for a plurality of target light amounts. Thus, even if target light amounts are changed according to requirements, it is possible to assuredly prevent the influence of mode-hopping noise by using a setting temperature corresponding to a current target light amount.

When using the semiconductor laser driving apparatus of the present invention as an apparatus for handling a color image, a plurality of semiconductor lasers for emitting laser beams having wavelengths different from each other are provided.

To correspond to the above case, a semiconductor laser driving apparatus of a sixth aspect of the present invention performs the control by the light amount control section and the decision of the setting temperature by the temperature deciding section for the plurality of semiconductor lasers emitting laser light of different wavelengths. Thus, it is possible to assuredly prevent the influence of mode-hopping noise for each of the semiconductor lasers.

A seventh aspect of the present invention is a semiconductor laser driving method for driving a semiconductor laser for emitting a laser beam for optical scanning. The present invention controls driving of the semiconductor laser such that, while the semiconductor laser is driven in a manner the same as for actual optical scanning, light amount of the laser light emitted from the semiconductor laser is a predetermined target light amount; and, during control of driving, alters temperature of one of a light-emitting section of the semiconductor laser and a vicinity of the light emitting section and, when the light amount of the laser light is within a predetermined error span, decides on the temperature of the one of the light-emitting section of the semiconductor laser and the vicinity of the light emitting section as a setting temperature for optical scanning of the semiconductor laser.

Therefore, because the semiconductor laser driving method of the seventh aspect of the present invention functions similarly to the invention of the first aspect, it is possible to determine the setting temperature under the same conditions as for actual optical scanning and assuredly prevent the influence of mode-hopping noise. Moreover, because the control and the decision of the setting temperature can be performed using various combinations of units for performing APC and ATC that are conventionally provided for a semiconductor laser driving apparatus, the apparatus is not increased in size and cost is not raised.

Further, an image-forming apparatus of an eighth aspect of the present invention includes a semiconductor laser driving apparatus according to the first aspect, a semiconductor laser to be driven by the semiconductor laser driving apparatus, a temperature control section for controlling the temperature adjusting section such that a temperature detected by a temperature detecting section becomes equal to a setting temperature decided by the temperature deciding section, and a recording medium on which an image will be formed by laser light emitted from the semiconductor laser.

According to the image-forming apparatus of the eighth aspect of the present invention, when the semiconductor laser is driven by the semiconductor laser driving apparatus, the temperature adjusting section is controlled by the temperature control section such that a temperature detected by the temperature detecting section becomes equal to the setting temperature decided by the temperature deciding section and, in the above state, the image is formed on the recording medium by the laser light emitted from the semiconductor laser.

Because the image-forming apparatus of the eighth aspect of the present invention controls the temperature of the light-emitting section of the semiconductor laser or the temperature near the semiconductor laser such that the temperature becomes equal to the setting temperature determined by the temperature deciding section of the semiconductor laser driving apparatus of the present invention while the image is being formed, it is possible to form a high-quality image in which the influence of mode-hopping noise is prevented.

As described above in detail, according to the semiconductor laser driving apparatus and a semiconductor laser driving method of the present invention, driving of a semiconductor laser is controlled such that light amount of laser light emitted from the semiconductor laser becomes equal to a predetermined target light amount while the semiconductor laser is driven in the same way as for actual optical scanning and, while the control is performed, the temperature of the light-emitting section of the semiconductor laser or the temperature near the semiconductor laser is changed and the temperature when light amount changes in the above case are kept in a predetermined error span is decided on as a setting temperature for the optical scanning by the semiconductor laser. Therefore, it is possible to determine the setting temperature in conditions the same as for actual optical scanning and to assuredly prevent the influence of mode-hopping noise. Moreover, advantages that the apparatus is not increased in size and costs are not raised are obtained because the above control and determination of the setting temperature can be performed using various combinations of units for performing APC and ATC that are conventionally provided for a semiconductor laser driving apparatus.

Moreover, an image-forming apparatus of the present invention controls the temperature of the light-emitting section of a semiconductor laser or the temperature near the semiconductor laser so as to become equal to a setting temperature decided by a temperature deciding section of the semiconductor laser driving apparatus of the present invention. Therefore, an advantage can be obtained that it is possible to form a high-quality image in which the influence of mode-hopping noise is prevented.

BRIEF DESCRIPTION OF THE DRAWINGS

FIG. 14 is a functional block digram showing a functional configuration of a conventional semiconductor laser driving apparatus.

DETAILED DESCRIPTION OF THE PREFERRED EMBODIMENTS

Embodiments of the present invention are described below with reference to the accompanying drawings.
(First Embodiment)

Figure 1:
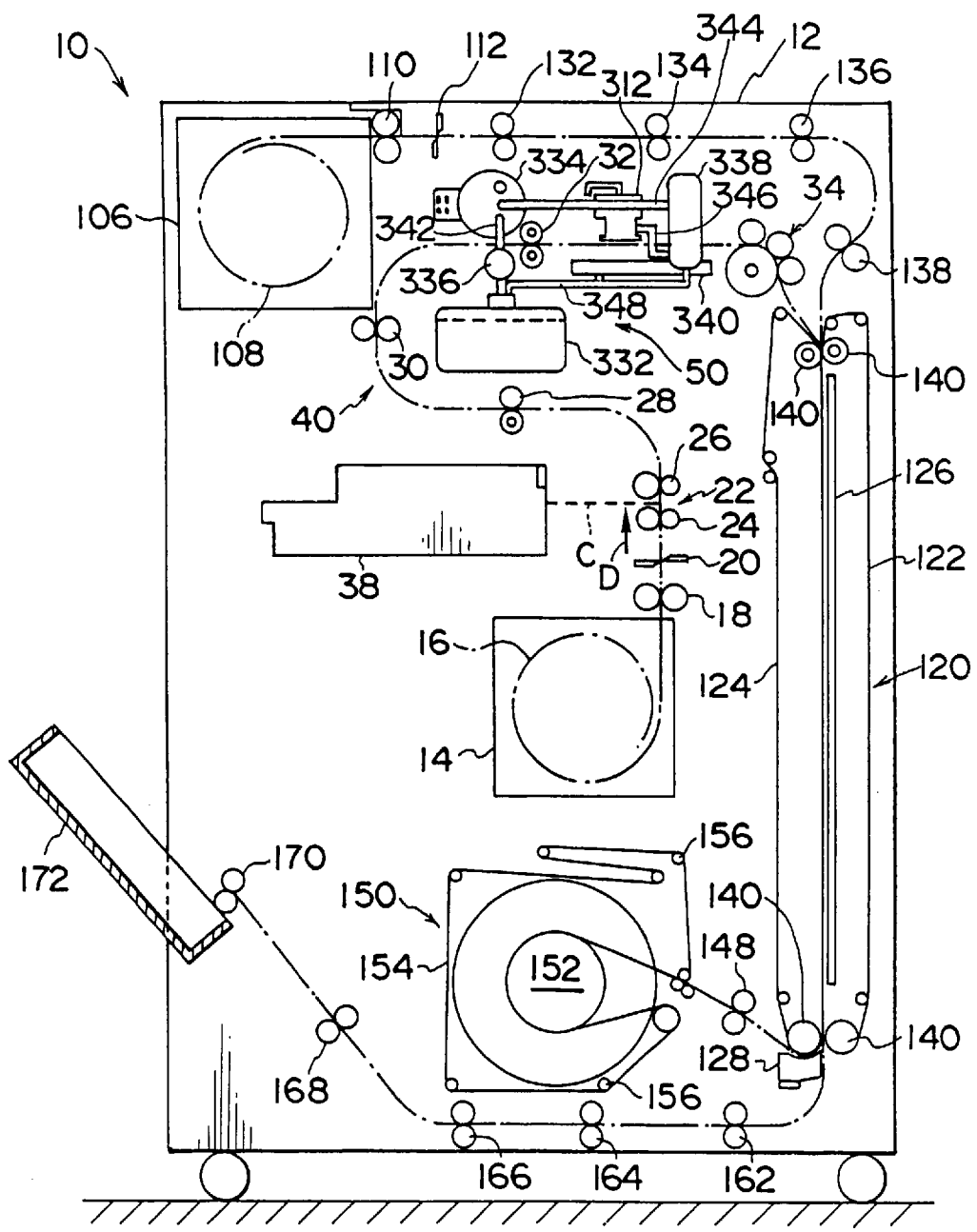
FIG. 1 is a schematic overall structural diagram of an image recording apparatus of an embodiment.

FIG. 1 shows a schematic overall structural diagram of an image recording apparatus 10 which is an image-forming apparatus of the first embodiment of the present invention.

A photosensitive material magazine 14 for storing a photosensitive material 16 that serves as a recording medium is set in a housing 12 of the image recording apparatus 10 shown in FIG. 1, in which the photosensitive material 16 is wound in a roll on the photosensitive material magazine 14 such that a photosensitive (exposure) face of the photosensitive material 16 drawn out of the photosensitive material magazine 14 is oriented to face leftward.

A nip roller 18 and a cutter 20 are arranged near the photosensitive-material takeout port of the photosensitive material magazine 14 so as to be able to take out the photosensitive material 16 from the photosensitive material magazine 14 up to a predetermined length and then cut the material 16. The cutter 20 is, for example, a rotary-type cutter formed by a fixed cutting edge and a movable cutting edge, which can cut the photosensitive material 16 by moving the movable cutting edge up and down with a rotary cam and engaging the movable cutting edge with the fixed cutting edge.

A plurality of carrying rollers 24, 26, 28, 30, 32, and 34 are arranged in order at a side of the cutter 20 and not-illustrated guide plates are disposed between the carrying rollers. The photosensitive material 16 cut to the predetermined length is first carried to an exposure position 22 provided between the carrying rollers 24 and 26.

An exposure apparatus 38 is provided at the left of the exposure position 22 as a semiconductor laser driving apparatus. Three types of semiconductor lasers for emitting laser beams having wavelengths different from each other, a lens unit, a polygon mirror, and a motor for rotating the polygon mirror are arranged in the exposure apparatus 38 and a ray C is emitted from the exposure apparatus 38 to the exposure position 22 so that the photosensitive material 16 is exposed.

A U-turn section 40 for carrying the photosensitive material 16 and bending the same through a U-shape, and a water applying section 50 for coating an image-forming solvent are formed above the exposure position 22. The present embodiment uses water as an image-forming solvent.

The photosensitive material 16 raised from the photosensitive material magazine 14 and exposed at the exposure position 22 is held and carried by the carrying rollers 28 and 30 and transported into the water applying section 50 after passing through an upward carrying path of the U-turn section 40.

A jet tank 312 is provided for the water applying section 50. The jet tank 312 has a jet nozzle (not illustrated) at a bottom thereof and is set such that the bottom faces the photosensitive material 16. Moreover, a water bottle 332 for storing the water that serves as the image-forming solvent is disposed below and left of the jet tank 312. A pump 336 is disposed above the water bottle 332. A filter 334 is disposed above the pump 336. These water bottle 332, pump 336, and filter 334 are connected by a water-feed pipe 342. The water stored in the water bottle 332 is pumped up by the pump 336, supplied to the filter 334 and filtered by the filter 334.

A subtank 338 is disposed at the right side of the jet tank 312. The subtank 338 is connected to the filter 334 by a water-feed pipe 344 and stores the water filtered by the filter 334 up to a predetermined quantity. The subtank 338 is connected to the jet tank 312 by a water-feed pipe 346 to supply the water stored in the subtank 338 to the jet tank 312.

That is, the water stored in the water bottle 332 is filtered by the filter 334 and temporarily stored in the subtank 338, and then supplied from the subtank 338 to the jet tank 312 and sprayed on the photosensitive material 16 from a jet nozzle of the jet tank 312. Thus, it is possible to apply water to the photosensitive material 16.

A tray 340 is set below the jet tank 312 to collect water that overflows from the jet tank 312. The tray 340 is connected to the water bottle 332 by a circulating pipe 348 to return the collected water to the water bottle 332. The circulating pipe 348 connects the water bottle 332 with the subtank 338 to return to the water bottle 332 water exceeding the predetermined quantity of water to be stored in the subtank 338.

An image-receiving material magazine 106 for storing an image-receiving material 108 is disposed at the left top corner of the housing 12. A pigment-fixing material containing a mordant is applied to the image-forming face of the image-receiving material 108 and the image-receiving material 108 is wound in a roll on the image-receiving material magazine 106 such that the image-forming face of the image-receiving material 108 drawn out of the image-receiving material magazine 106 faces downward.

A nip roller 110 is disposed near an image-receiving-material takeout port of the image-receiving material magazine 106 to draw the image-receiving material 108 out of the image-receiving material magazine 106, and the nipping can be released.

A cutter 112 is disposed at a side of the nip roller 110. The cutter 112 is, for example, a rotary-type cutter formed by a fixed cutting edge and a movable cutting edge similarly to the above-described photosensitive-material cutter 20, so as to cut the image-receiving material 108 drawn out of the image-receiving material magazine 106 to a shorter length than the photosensitive material 16.

Carrying rollers 132, 134, 136, and 138 and not-illustrated guide plates are arranged at a side of the cutter 112 to carry the image-receiving material 108 cut to a predetermined length toward a heat-developing and transferring section 120.

The heat-developing and transferring section 120 has a pair of endless belts 122 and 124 wound on a plurality of winding rollers 140 and respectively vertically extended and looped. Therefore, when any one of these winding rollers 140 is rotated, the endless belts 122 and 124 wound on these winding rollers 140 are rotated.

A heating plate 126 formed into a vertically extended flat plate is disposed inside the loop of the right endless belt 122 facing the left inner-periphery of the endless belt 122. A not-illustrated linear heater is disposed in the heating plate 126 such that the surface of the heating plate 126 can be heated to a predetermined temperature.

The photosensitive material 16 is supplied between the endless belts 122 and 124 of the heat-developing and transferring section 120 by the final carrying roller 34 in a carrying path. Moreover, the image-receiving material 108 is carried synchronously with carrying of the photosensitive material 16 and supplied between the endless belts 122 and 124 of the heat-developing and transferring section 120 by the final carrying roller 138 in a carrying path while the photosensitive material 16 advances by the predetermined length and is superposed with the photosensitive material 16.

At this time, because the image-receiving material 108 has width and length smaller than those of the photosensitive material 16, the photosensitive material 16 is superposed with the periphery of four sides of the photosensitive material 16 protruding beyond the periphery of the image-receiving material 108.

Thus, the photosensitive material 16 and image-receiving material 108 superposed by the endless belts 122 and 124 are held and carried by the endless belts 122 and 124 whilst superposed. Moreover, when the superposed photosensitive material 16 and image-receiving material 108 are completely set between the endless belts 122 and 124, the endless belts 122 and 124 temporarily stop rotation and the held photosensitive material 16 and image-receiving material 108 are heated by the heating plate 126. The photosensitive material 16 is heated by the heating plate 126 through the endless belt 122 while held and carried and stopped. While the material 16 is being heated, the same discharges a movable pigment and, at the same time, the pigment is transferred to a pigment-fixing layer of the image-receiving material 108 and an image is obtained on the image-receiving material 108.

A separation pawl 128 is disposed at the material feed direction downstream side of the endless belts 122 and 124. The separation pawl 128 engages with, of the photosensitive material 16 and image-receiving material 108 held and carried between the endless belts 122 and 124, the front end of only the photosensitive material 16 to separate the front end of the photosensitive material 16 protruding beyond the endless belts 122 and 124 from the image-receiving material 108.

A photosensitive-material ejection roller 148 is disposed to the left of the separation pawl 128 to carry the photosensitive material 16 which has been guided by the separation pawl 128 and moved to the left further toward a used photosensitive material storing section 150.

The used photosensitive material storing section 150 has a drum 152 onto which the photosensitive material 16 is wound and a belt 154, a part of which is wound round the drum 152. The belt 154 is wound round a plurality of rollers 156, the belt 154 is rotated in accordance with the rotation of these rollers, and thus the drum 152 rotates.

Therefore, when the photosensitive material 16 is supplied while the belt 154 is rotated in accordance with the rotation of the rollers 156, the photosensitive material 16 is collected around the drum 152.

Moreover, in FIG. 1, image-receiving material ejection rollers 162, 164, 166, 168, and 170 are arranged such that the image-receiving material 108 can be carried from the bottom of the endless belts 122 and 124 to the left. The image-receiving material 108 ejected from the endless belts 122 and 124 is carried by these image-receiving-material ejection rollers 162, 164, 166, 168, and 170 and ejected to a tray 172.

Figure 2B:
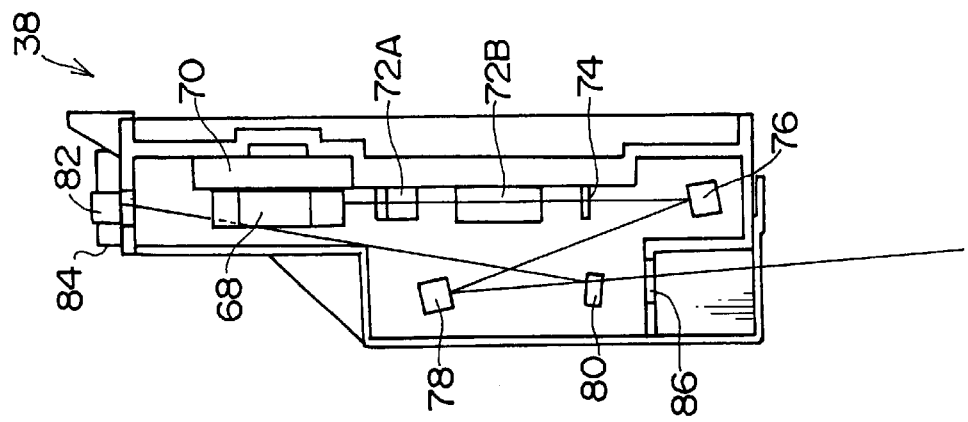
FIG. 2B is a sectional side view showing the schematic configuration of the exposure apparatus, taken along the line X-X' in FIG. 2A.
Figure 2A:
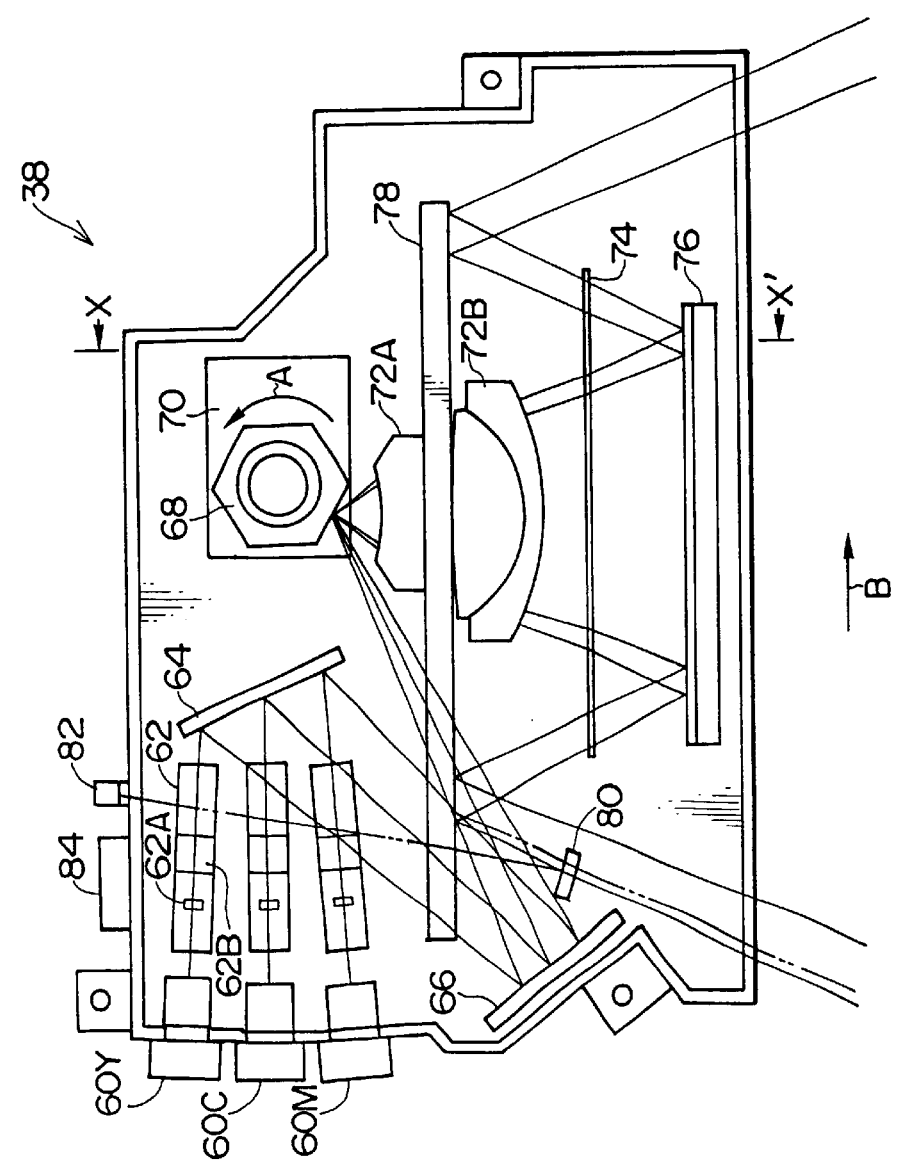
FIG. 2A is a sectional top view showing a schematic configuration of an exposure apparatus of the embodiment.

Next, the configuration of the exposure apparatus 38 is described below in detail with reference to FIGS. 2A and 2B. FIG. 2A is a sectional top view of the exposure apparatus 38 and FIG. 2B is a sectional side view of the exposure apparatus 38, taken along the line X-X' in FIG. 2A.

As shown in FIG. 2A, the exposure apparatus 38 has three laser-beam sources 60C, 60M, and 60Y.

The laser-beam source 60C (cyan) is an image-forming light source which includes a semiconductor laser formed by a laser diode (LD) for emitting a laser beam of approximately 750 nm and a photodiode (PD) for detecting the light amount of the laser beam emitted from the LD.

The laser-beam source 60M (magenta) is an image-forming light source which includes a semiconductor laser formed by an LD for emitting a laser beam of approximately 680 nm and a PD for detecting the light amount of the laser beam emitted from the LD.

The laser-beam source 60Y (yellow) is an image-forming light source which includes a semiconductor laser formed by an LD for emitting a laser beam of approximately 810 nm and a PD for detecting the light amount of the laser beam emitted from the LD.

Figure 3:
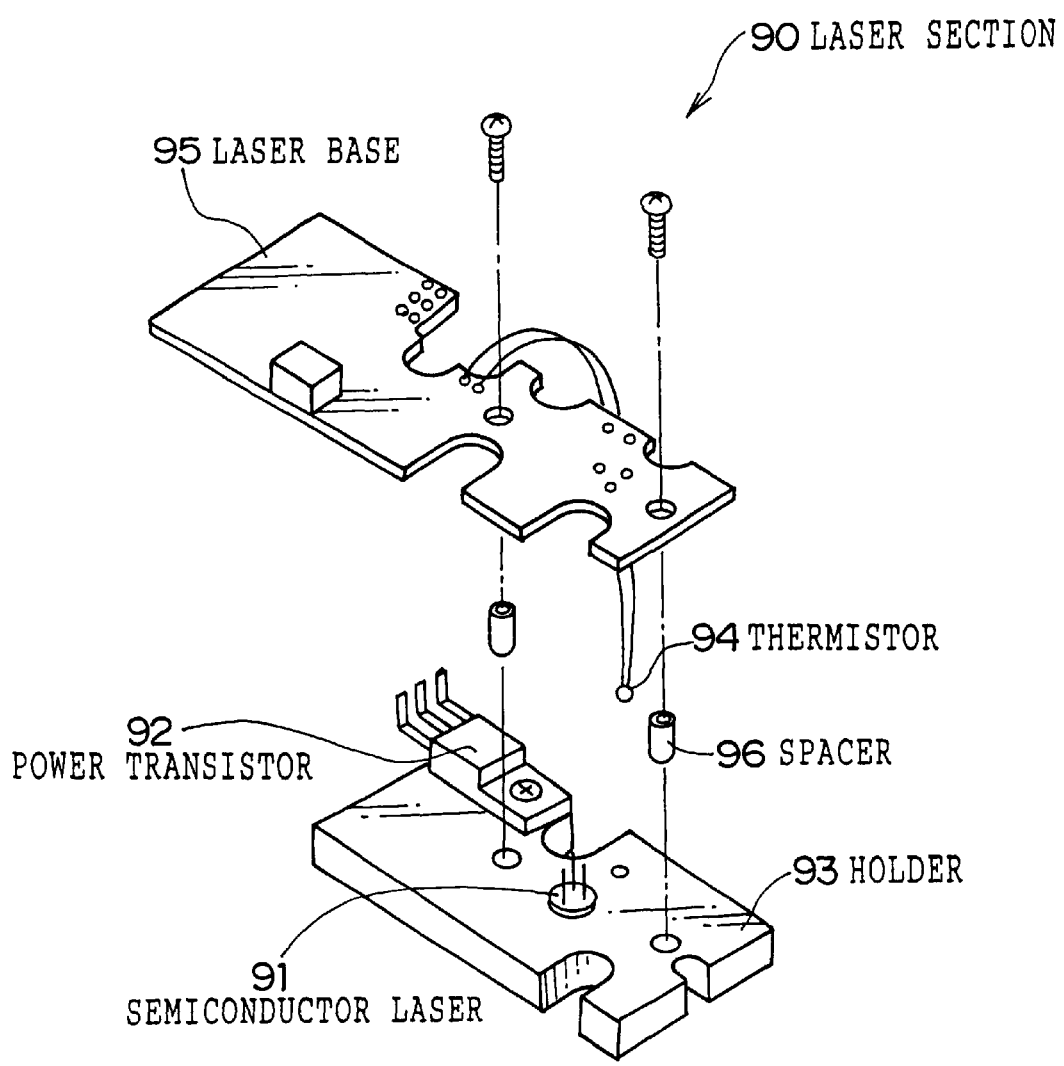
FIG. 3 is an exploded perspective view of a laser section of the exposure apparatus of the embodiment.

FIG. 3 shows an exploded perspective view of a configuration (hereafter referred to as laser section 90) including a base on which semiconductor lasers of the laser-beam sources 60C, 60M, and 60Y are mounted and peripherals of the base.

As shown in FIG. 3, the laser section 90 is formed by a holder 93 connected with a laser base 95 by screws through spacers 96. A semiconductor laser 91 and a power transistor 92 are disposed at predetermined positions on the holder 93. A thermistor 94 is soldered to the laser base 95. Terminals of the semiconductor laser 91 are soldered to corresponding through-holes (terminals).

A power transistor 92 is disposed at the holder 93 in the same way as the semiconductor laser 91 to raise the temperature of an LD included in the semiconductor laser 91, and corresponds to a temperature adjusting section of the present invention. Moreover, a thermistor 94 is formed so as to be located near the semiconductor laser 91 of the holder 93 when the laser base 95 and holder 93 are integrally formed, detects the temperature of the LD included in the semiconductor laser 91 a "laser section temperature" of the present invention, and corresponds to a temperature detecting section of the present invention. The holder 93 is formed of aluminum having a high heat conductivity and, thus, the temperature of the LD can be efficiently raised by the power transistor 92 and the temperature of the LD can be accurately detected by the thermistor 94.

As shown in FIGS. 2A and 2B, an optical system 62 formed by including a collimator lens 62A, which changes incident light to a substantially parallel light flux, and a cylindrical lens 62B, for forming the emitted light flux to be substantially circular, is disposed at a laser light emitting side of each of the laser-beam sources 60Y, 60C, and 60M.

A plane mirror 64 is disposed at a light-emitting side of the optical systems 62, a plane mirror 66 is disposed in the direction each laser beam is reflected by the plane mirror 64, and a polygon mirror 68, which is rotated in the direction of arrow A by a motor 70 is disposed in the direction of reflection of each laser beam from the plane mirror 66. The laser beam emitted from each of the three optical systems 62 is reflected from the plane mirror 64, then reflected from the plane mirror 66, radiated to substantially the same position on a reflecting plane of the polygon mirror 68, and reflected from the polygon mirror 68.

fθ lenses 72A and 72B, a plane-tilt-correcting cylindrical lens 74 having power in a subscanning direction, and a cylindrical mirror 76 are arranged in order at a laser light emitting side of the polygon mirror 68, and a return mirror 78 is disposed at a laser light emitting side of the cylindrical mirror 76.

As shown in FIGS. 2A and 2B, three laser beams reflected from the polygon mirror 68 pass through the fθ lenses 72A and 72B and the cylindrical lens 74 in order, are reflected from the cylindrical mirror 76, and then reflected from the return mirror 78 and emitted to the outside of the exposure apparatus 38 through an opening 86.

A mirror 80 for reflecting laser light is disposed in a direction of reflection of laser light from the return mirror 78, near a start position side of laser beam scanning-exposure due to the rotation of the polygon mirror 68. A scanning-start-position detecting sensor (hereafter referred to as "SOS-detecting sensor") 82 for detecting the reflected laser light is set in the direction of reflection of laser light from the mirror 80. In the present embodiment, a signal output from the SOS-detecting sensor 82 (hereafter referred to as "sensor output signal") is normally set to a low level and is set to a high level only when laser light is detected.

A fan 84 is disposed at a side of the laser-beam sources 60Y, 60C, and 60M of the exposure apparatus 38. The fan 84 cools the inside of the exposure apparatus 38, and corresponds to the temperature adjusting section of the present invention.

Figure 4:
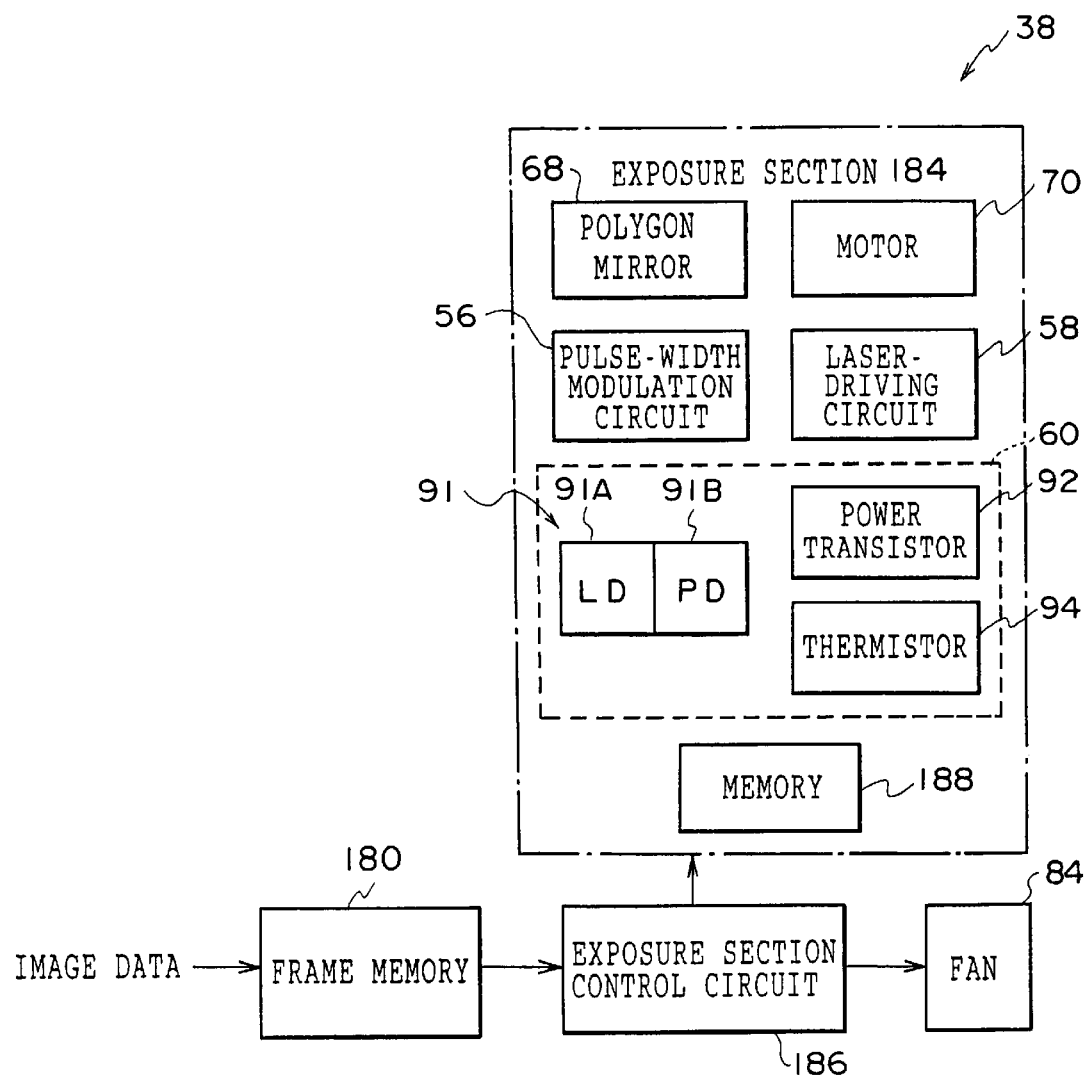
FIG. 4 is a block diagram showing a schematic configuration of the electrical system of the exposure apparatus of the embodiment.

FIG. 4 shows a schematic configuration of the electrical system of the exposure apparatus 38. As shown in FIG. 4, the exposure apparatus 38 has a frame memory 180 for storing image data (image data showing R, G, and B density for each pixel of an image to be recorded on the photosensitive material 16). The frame memory 180 is connected to an exposure section control circuit 186, and the exposure section control circuit 186 is connected to an exposure section 184.

The exposure section 184 has three laser-beam sources 60 each including the semiconductor laser 91 formed by an LD 91A and PD 91B, and the power transistor 92 and thermistor 94 corresponding to each semiconductor laser 91 and corresponding to three colors, C, M, and Y (although there are three sources, 60C, 60M, and 60Y, FIG. 4 shows only one source). The exposure section 184 also has three systems each having a pulse-width modulation circuit 56 and a laser-driving circuit 58 (FIG. 4 shows only one system), and further has the polygon mirror 68, the motor 70 for rotating the polygon mirror 68, and a memory 188 for storing a setting temperature (control temperature) and target light amount of each LD 91A.

The exposure apparatus 38 of the present embodiment uses a system for modulating a laser beam by direct modulation with a pulse-width modulation signal (hereafter referred to as "PWM signal"). That is, for each color, the exposure section control circuit 186 decides an exposure value at each pixel in one line in accordance with density of image data, and outputs a signal representing the exposure values to the corresponding pulse-width modulation circuit 56 for each line.

The pulse-width modulation circuit 56 generates PWM signals, wherein a larger duty ratio representing a higher exposure value, for each line, in accordance with the signal representing the exposure values for every pixel of the each line, which signal is input from the exposure section control circuit 186. The pulse-width modulation circuit 56 outputs the PWM signals to the corresponding laser-driving circuit 58.

The laser-driving circuit 58 is a circuit for driving the corresponding LD 91A, and supplies a driving current corresponding to a preset target light amount to the corresponding LD 91A for a duration corresponding to the pulse width of each pixel of the PWM signals input from the pulse-width modulation circuit 56. As a result, each LD 91A emits light at the above preset target light amount only for durations decided in accordance with densities of the image data.

The fan 84 is connected to the exposure section control circuit 186, which controls operation of the fan 84. The PD 91B corresponds to a light amount detecting section of the present invention. Moreover, the exposure section control circuit 186 corresponds to a light amount control section, a temperature control section, and a temperature determining section of the present invention.

Figure 5:
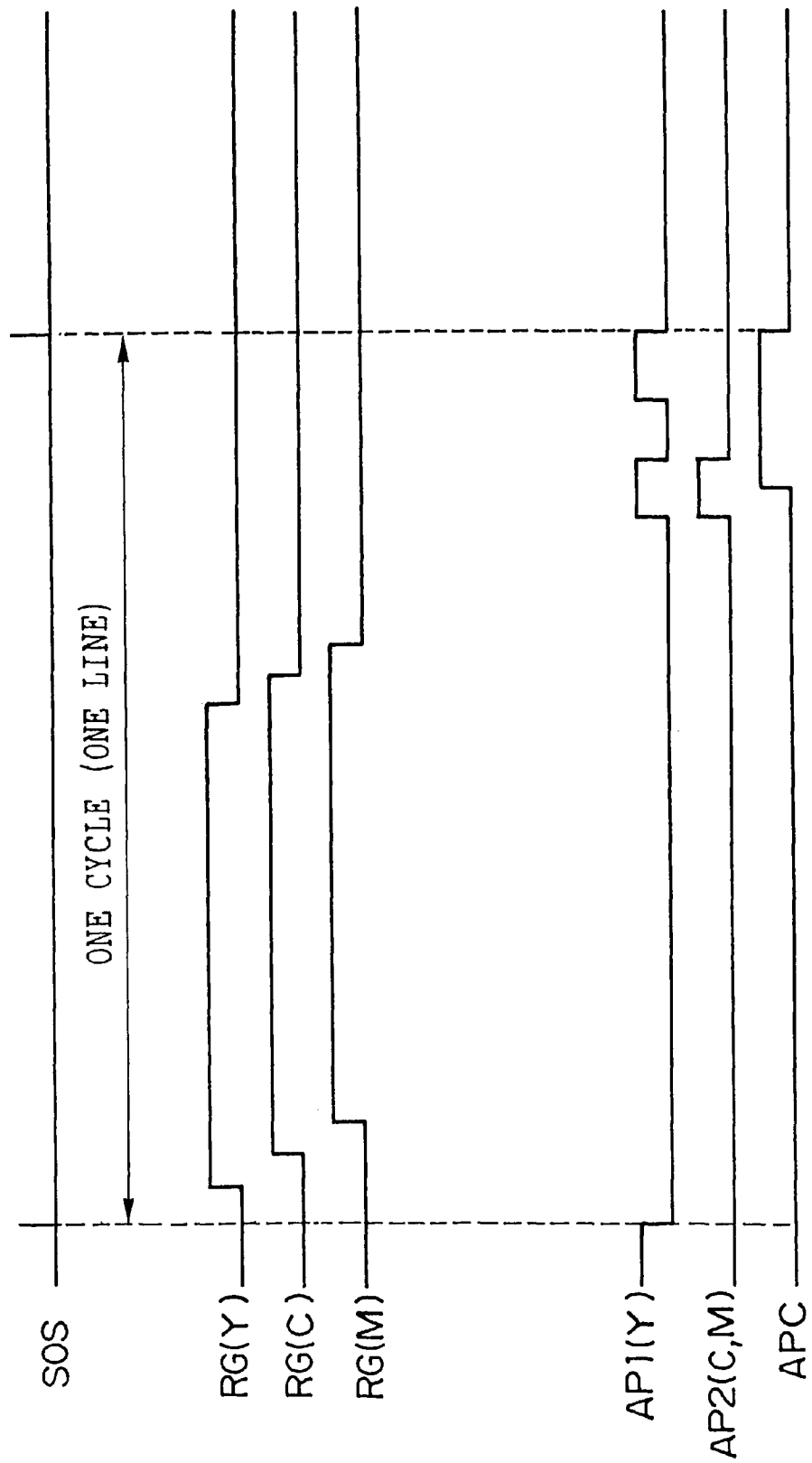
FIG. 5 is a timing chart of various signals when the exposure apparatus of the embodiment forms an image.

FIG. 5 shows a timing chart of various signals used to form a desired image on the photosensitive material 16 by actually performing optical scanning with the exposure apparatus 38 according to the present embodiment. In FIG. 5, 'SOS' denotes a sensor output signal output from the SOS-detecting sensor 82, and one cycle of the signal corresponds to an image-forming period for one line. Moreover, in FIG. 5, 'RG' denotes a signal representing an effective image emission period for causing the LDs 91A for Y, C, and M to emit light in accordance with the image data, 'AP1' denotes a signal showing an LD-emission effective period necessary for automatic power control (APC) of the LD 91A for Y, 'AP2' denotes a signal showing an LD-emission effective period necessary for APC of the LDs 91A for C and M, and 'APC' denotes a signal showing a period for detecting a light amount obtained by APC. As shown in FIG. 5, the exposure apparatus 38 of the present embodiment performs APC for each line to form a desired image on the photosensitive material 16.

Figure 6:
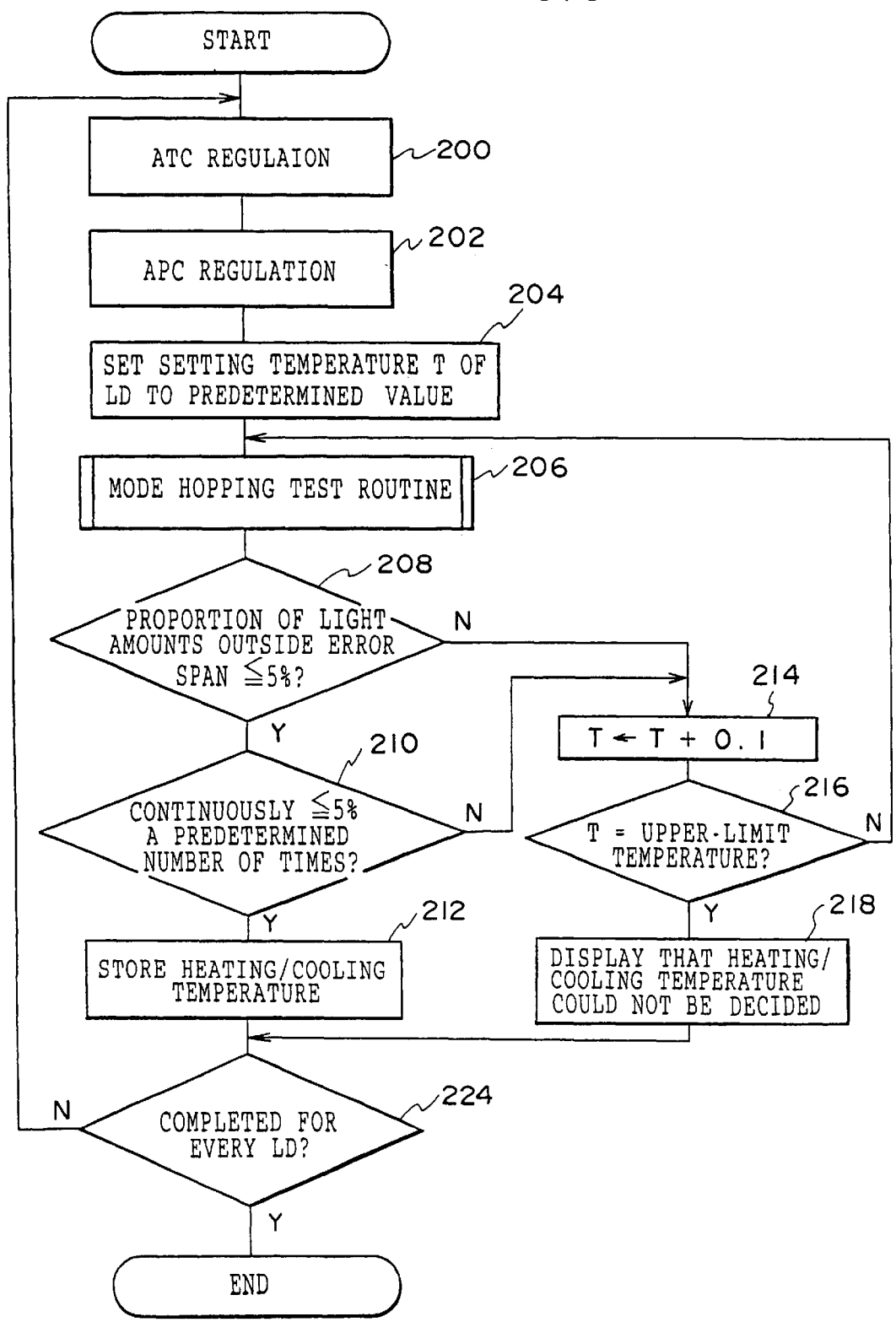
FIG. 6 is a flowchart showing flow of a control temperature decision processed to be executed by an exposure apparatus of a first embodiment.
Figure 7:
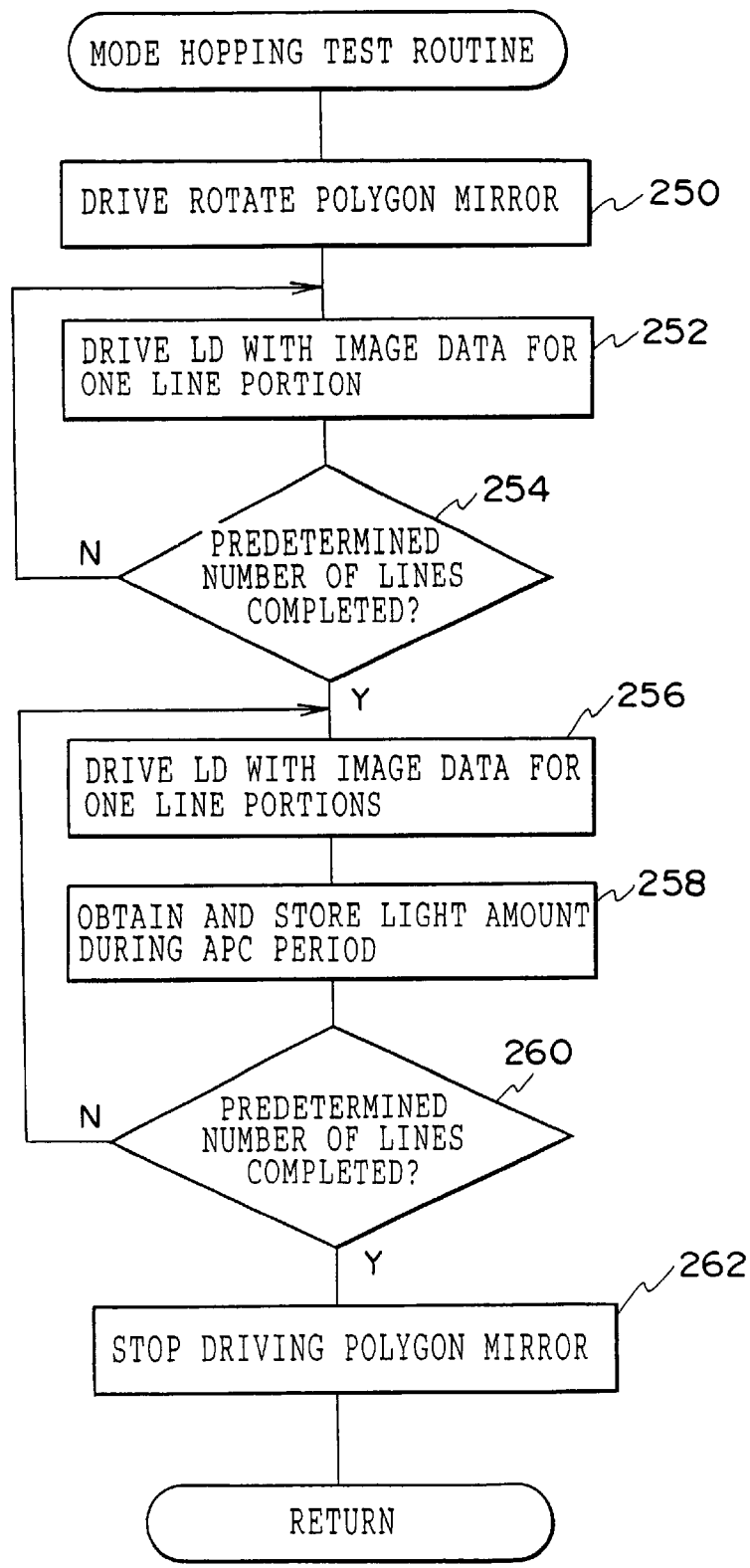
FIG. 7 is a flowchart showing a flow of processing of a mode-hopping test routine to be executed during execution of the control temperature decision process.

Next, functions of the present embodiment are described. The exposure apparatus 38 of the image recording apparatus 10 of the present embodiment performs processing for deciding the setting temperature (control temperature) (hereafter referred to as "control temperature decision") of the LD 91A included in each of the three semiconductor lasers 91 when a not-illustrated power switch of the image recording apparatus 10 is turned on. The control temperature decision is first described below with reference to FIGS. 6 and 7. FIGS. 6 and 7 are flowcharts showing flows of the processing to be executed by the exposure section control circuit 186 of the exposure apparatus 38 when a power switch of the image recording apparatus 10 is turned on. Moreover, the memory 188 provided for the exposure apparatus 38 stores a target light amount and control temperature of the LD 91A included in each of the three semiconductor lasers 91.

In step 200 in FIG. 6, automatic temperature control (ATC) is performed: A control temperature of one of the LDs 91A is read from the memory 188 and the value of a voltage applied to the power transistor 92 corresponding to the LD 91A is controlled such that the temperature of the LD 91A, which is detected by the thermistor 94 corresponding to the LD 91A, is held constant at the read control temperature. At this time, because the semiconductor laser 91, which includes the LD 91A, and the power transistor 92 are held by the holder 93 which is formed of aluminum and has a high heat conductivity, it is possible to efficiently adjust the temperature of the LD 91A. If the control temperature is lower than the current temperature, the temperature is quickly lowered toward the control temperature of the LD 91A by rotating the fan 84.

When the temperature detected by the thermistor 94 corresponding to the LD 91A is stabilized at the above control temperature, APC is performed (step 202): The target light amount of the LD 91A is read out of the memory 188, the LD 91A is continuously turned on, and the value of the driving current of the LD 91A is controlled such that a light amount of the LD 91A detected by the corresponding PD 91B becomes equal to the thus read target light amount.

When the light amount detected by the PD 91B corresponding to the LD 91A is stabilized at the target light amount, the value of a voltage to be applied to the power transistor 92 is set in step 204 such that a setting temperature T (at this point in time, the control temperature) of the LD 91A is a predetermined value (35° C. in the present embodiment). If this predetermined value is lower than the current temperature, the temperature is quickly lowered to the predetermined value by rotating the fan 84.

When the temperature detected by the thermistor 94 corresponding to the LD 91A has stabilized at the predetermined value, a mode-hopping test routine is executed in step 206. Next, the mode-hopping test routine is described below with reference to FIG. 7. In the present embodiment, the mode-hopping test routine of the present embodiment obtains the light amount of the LD 91A while driving the LD 91A using predetermined image data for image processing the same as in a case of actual optical scanning, that is, while driving the LD 91A for processing with the timings shown in FIG. 5. Image data corresponding to a gray image having the same values for each of R, G, and B is prepared as the predetermined image data for the present embodiment.

First, in step 250, the polygon mirror 68 is rotated at a predetermined speed in the direction of the arrow A in FIG. 2 by driving of the motor 70. In the next step 252, an exposure value corresponding to density of the image data corresponding to the LD 91A is decided for each pixel of the first line from the above predetermined image data. A signal representing the exposure value is output to the pulse-width modulation circuit 56 of the exposure section 184. Thus, PWM signals corresponding to densities of first-line image data from the predetermined image data are input to the corresponding laser-driving circuit 58.

When PWM signals for one line are input to the laser-driving circuit 58, the laser-driving circuit 58 supplies a driving current corresponding to the above target light amount to the corresponding LD 91A in accordance with the input PWM signals. Thus, the LD 91A is driven so as to repeatedly start and stop emission in accordance with densities of the image data for one line.

In the next step 254, it is determined whether outputting to the pulse-width modulation circuit 56 of signals representing the above exposure values corresponding to the image data has been completed for a predetermined number of lines (200 lines in the present embodiment). If the outputting is not complete, (a negative result is obtained), the above step 252 is restarted to output the signals representing the exposure values corresponding to the image data for the next one line to the pulse-width modulation circuit 56. When the outputting is complete (an affirmative result is obtained), step 256 is started.

By repeating the above steps 252 and 254, the LD 91A is repeatedly driven for a predetermined number of lines of the predetermined image data. For each line, APC is performed in an APC period (a period when the APC signal is kept high-level in FIG. 5).

In step 256, an exposure value corresponding to the density of the image data corresponding to the LD 91A is decided for each pixel of the next one line from the predetermined image data. A signal representing the exposure value is output to the pulse-width modulation circuit 56 of the exposure section 184, in the same way as in the above step 252. Thus, the same as above, the LD 91A is driven so as to repeatedly start and stop emission in accordance with the densities of the image data for the one line.

In the next step 258, the light amount of the LD 91A is obtained in accordance with a signal output from the PD 91B in the aforementioned APC period and the obtained light amount "image line light amount" of the present invention is stored in a predetermined region of the memory 188.

In the next step 260, it is determined whether outputting to the pulse-width modulation circuit 56 of signals representing the above exposure values corresponding to the image data has been completed for a predetermined number of lines (1,000 lines in the present embodiment). If the outputting is not complete (a negative result is obtained), the above step 256 is restarted to output the signals representing the exposure values corresponding to the image data for the next one line to the pulse-width modulation circuit 56. When the outputting is complete (an affirmative result is obtained), step 262 is started.

By repeating the above steps 256 to 260, the light amount values for 1,000 lines at the temperature that was set in step 204 (refer to FIG. 6) are stored in the predetermined region of the memory 188. Also, APC is performed in the APC period for each line.

In step 262, the rotation of the polygon mirror 68 is stopped by stopping the driving of the motor 70. The mode-hopping test routine is complete and control returns to step 208 (refer to FIG. 6).

During the repetition of steps 252 and 254, only driving of the LD 91A is performed and the light amount of the LD 91A is not obtained. This is in order to exclude the influence of so-called droop, in which optical output increases when temperature of an LD is low, and overshoot occurs.

In step 208, the light amounts for 1,000 lines obtained by the mode-hopping test routine are compared with a predetermined tolerance range (corresponding to an error span of the present invention) to determine whether or not a proportion of the number of light amounts outside the tolerance range with respect to the total number of light amounts (1,000 in the present embodiment) is equal to or lower than a predetermined proportion (5% in the present embodiment). If this proportion (an "error proportion" of the present invention) is equal to or lower than the predetermined proportion (an affirmative result is obtained), step 210 is started, with the assumption that mode-hopping noise sufficient to cause visible irreguralities in a formed image was not generated. However, when the proportion is not equal to or lower than the predetermined proportion (a negative result is obtained), step 214 is started with the assumption that mode-hopping noise sufficient to cause visible irreguralities was generated.

Figure 8:
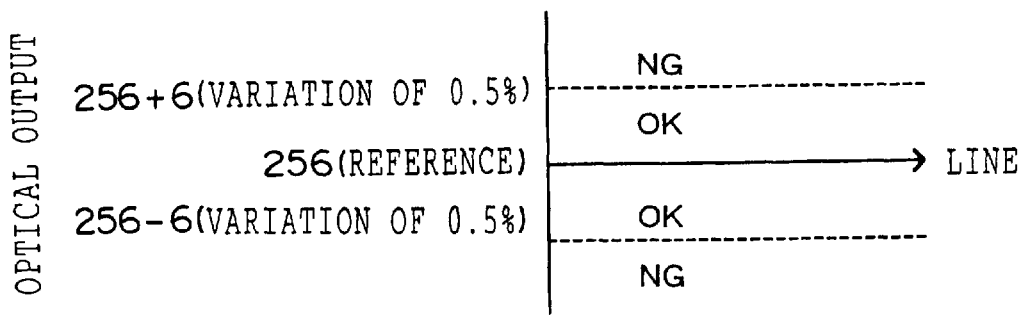
FIG. 8 is a schematic view for explaining quality determination of a result of a mode-hopping test.
Figure 9:
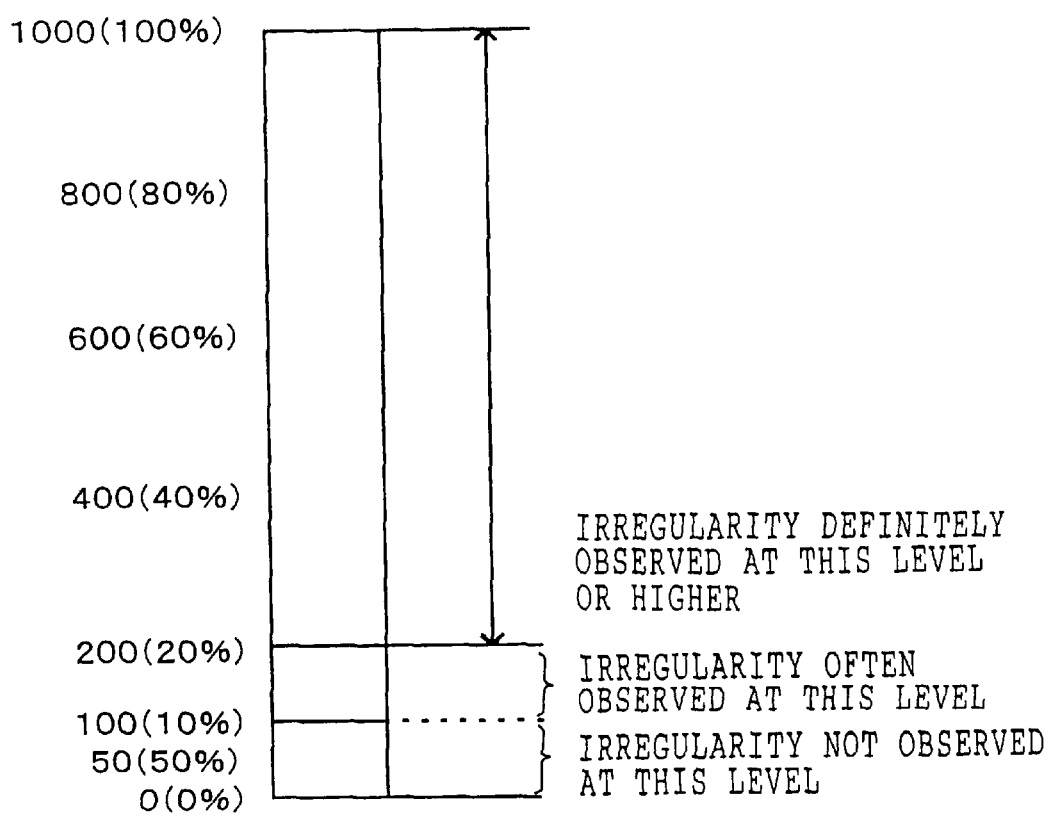
FIG. 9 is a schematic view for explaining quality determination of the result of the mode-hopping test.

As described above, it is estimated that when maximum fluctuations of light amount of a laser beam exceed approximately 1%, visible irregularities occur in a recorded image. Therefore, in the present embodiment, the above tolerance range is kept to a range of ±0.5% of a target light amount (in FIG. 8, '256' is a value corresponding to the target light amount).

In the present embodiment, the predetermined proportion is set to 5%, in accordance with results of the following experiment.

Using data for a gray solid image, the same processing as the above mode-hopping test routine was performed and light amounts were obtained for 1,000 lines. Images were formed with different numbers of the obtained light amounts outside the above tolerance range, between 0 and 1,000. Each image was visually observed by a plurality of persons. Images in which the number of light amounts outside the tolerance range was less than 100, that is, the proportion of the number of light amounts outside the tolerance range with respect to the total number of light amounts was less than 10%, were not observed as having irregularities. However, images in which the number of light amounts outside the tolerance range was 100 or more and less than 200 could be observed as having irregularities. Moreover, images in which the number of light amounts outside the tolerance range was equal to or more than 200 were assuredly observed as having irregularities.

Therefore, in the present embodiment, the predetermined proportion is set to 5%, with a margin of 10%.

In step 210, it is determined whether the proportion of the number of light amounts outside the tolerance range has been 5% or less up to a predetermined consecutive number of times (10 times in the present embodiment). If the proportion is continuously 5% or less (an affirmative result is obtained), step 212 is started and the setting temperature T of the LD 91A at this point of time is stored in a predetermined region of the memory 188 as the control temperature, and then step 224 is started. The stored control temperature is thereafter used as the control temperature for actually forming images. Therefore, the control temperature corresponds to the setting temperature of the present invention. However, when it is determined in step 210 that the proportion is not continuously 5% or less (a negative result is obtained), step 214 is started.

In step 214, the value of a voltage to be applied to the power transistor 92 is set such that the setting temperature T of the LD 91A is increased by a predetermined temperature interval (0.1° C. in the present embodiment). In the next step 216, it is determined whether or not the setting temperature T has reached a preset upper-limit temperature (45° C. in the present embodiment). If the setting temperature T reaches the upper-limit temperature (an affirmative result is obtained), step 218 is started and a message showing that the control temperature of the LD 91A could not be determined is displayed on a not-illustrated display section provided for the image recording apparatus 10, and then step 224 is started. If the setting temperature T has not reached the upper-limit temperature (a negative result is obtained), step 206 is restarted to execute the mode-hopping test routine again.

By repeating the above steps 206 to 218, when a state in which the proportion of light amounts outside the tolerance range obtained by the mode-hopping test routine for 1,000 lines of the LD 91A is 5% or less continues for the aforementioned predetermined number of times, the setting temperature T at that point in time is decided on as a subsequent control temperature. However, in another case, the mode-hopping test is repeatedly executed and the setting temperature T is raised in intervals of 0.1° C. up to the upper-limit temperature.

In step 224, it is determined whether or not processing from step 200 to step 218 has been completed for all the LDs 91A provided in the exposure apparatus 38. If the processes are not complete (a negative result is obtained), control returns to step 200. When the processes are complete (an affirmative result is obtained), the control temperature decision is complete.

Figure 10:
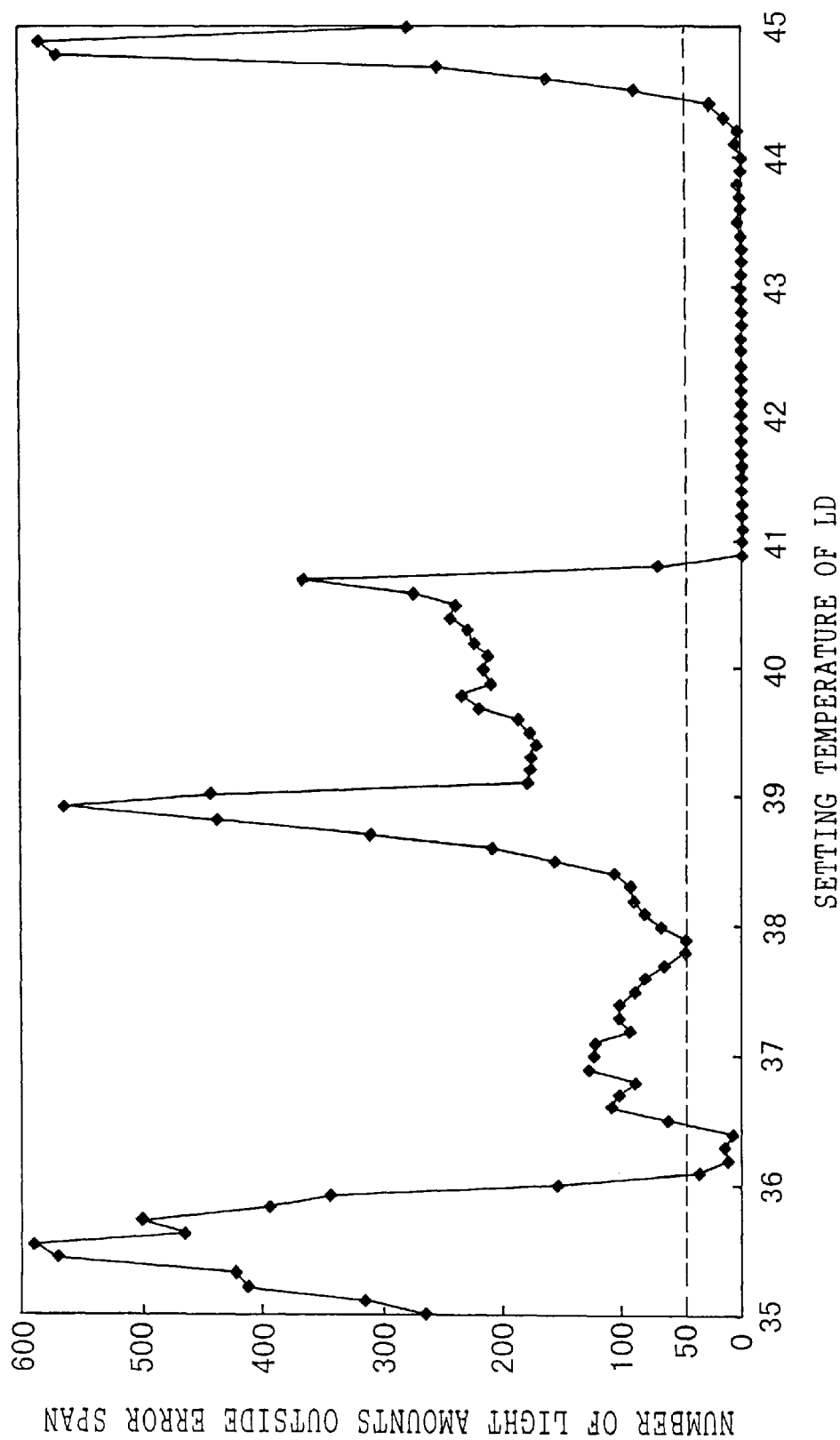
FIG. 10 is a graph showing a relation between setting temperature and number of light amounts outside the tolerance range of a laser diode, obtained through a mode-hopping test.

FIG. 10 shows a relation between setting temperature of the LD 91A obtained through control temperature decision and numbers of light amounts outside a tolerance range. In the case of the control temperature decision of the present embodiment, performance of mode-hopping tests is stopped when the proportion of the number of light amounts outside the tolerance range is 5% or less for a predetermined consecutive number of times. In FIG. 10, however, a case is assumed in which a mode-hopping tests are repeated until the setting temperature T reaches the upper-limit temperature.

In the case of the example shown in FIG. 10, first a range of 36.1° C. to 36.4° C. is obtained as temperatures at which the number of light amounts outside the tolerance range is 50 or less (5% or less). In the case of this range, however, the control temperature is not decided because the state in which the number of light amounts outside the tolerance range is 50 or less does not continue for the predetermined number of times (10 times). However, the state continues for the predetermined number of times to 41.8° C. Therefore, 41.8° C. is decided as the control temperature.

Figure 11:
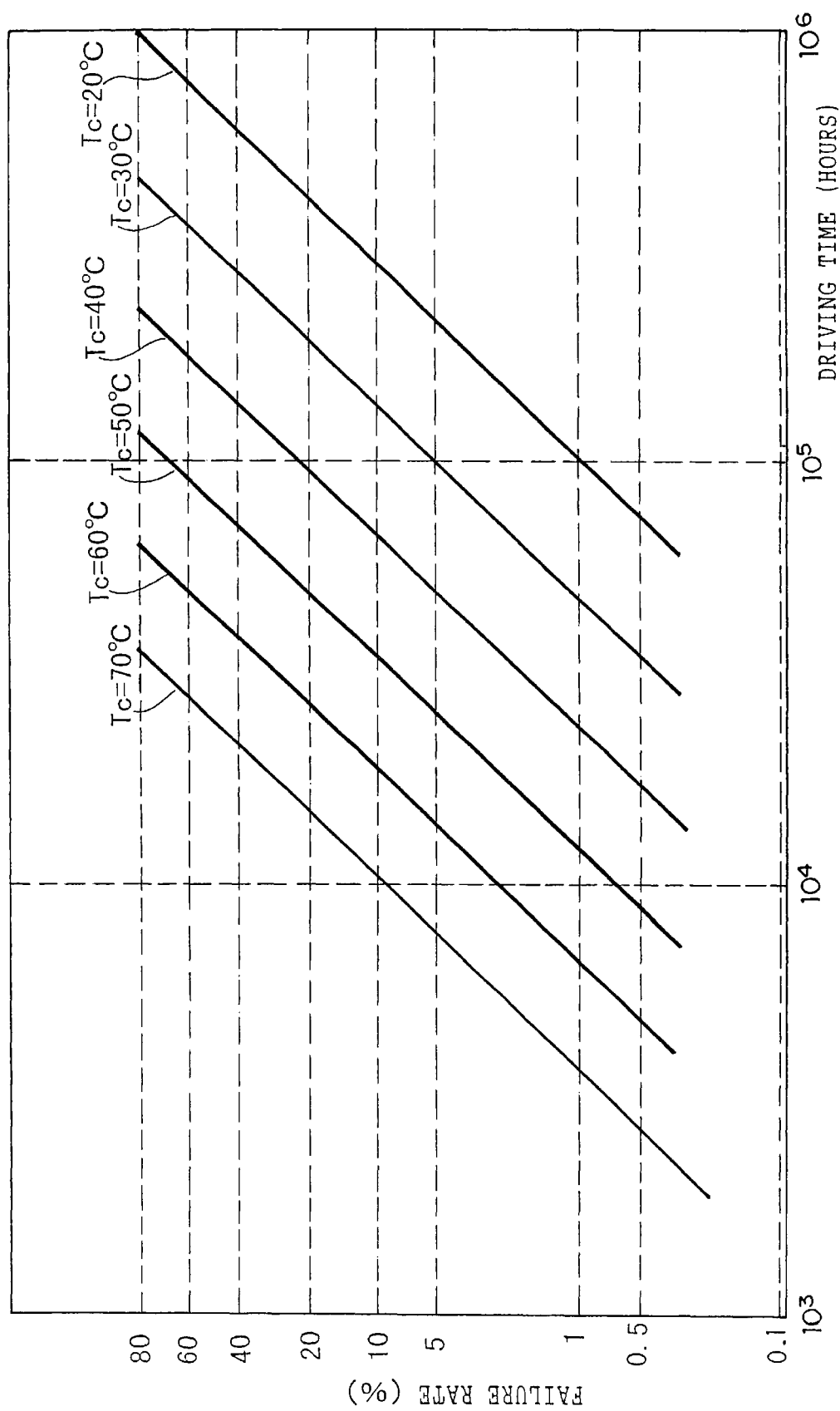
FIG. 11 is a graph showing relations between driving times and failure rates of a marketed laser diode at various control temperatures.

In the present embodiment, the setting temperature T of the LD is slowly raised from a low temperature when performing mode-hopping tests. This is because a lower temperature is preferable as a control temperature of an LD. That is, LDs have a characteristic that failure rate with LD driving time is lower as the control temperature Tc is lower. In order words, the service life of the LD is longer as the control temperature Tc is lower. Therefore, it is preferable that the control temperature of the LD is as low as possible. FIG. 11 shows relations between driving times and failure rates of a marketed LD at various control temperatures.

Next, operation (image exposure) of the exposure apparatus 38 when actually forming an image is described below.

The exposure section control circuit 186 performs ATC by first reading the control temperature of each LD 91A, which was stored in the memory 188 as a result of the above-described control temperature decision and controlling the value of the voltage to be applied to the corresponding power transistor 92 such that the temperature of the LD 91A detected by the corresponding thermistor 94 becomes constant at the corresponding control temperature. At this time, if the control temperature is lower than the current temperature, the temperature is quickly lowered to the control temperature of the LD 91A by driving of the fan 84.

Then, the circuit 186 performs APC by reading the target light amount of each LD 91A from the memory 188, supplying a current to the each LD 91A to make the each LD 91A continuously emit light, and controlling the value of the driving current of the LD 91A such that the light amount of the LD 91A detected by the corresponding PD 91B becomes constant at the target light amount.

Then, the exposure section control circuit 186 reads data for an image to be recorded on the photosensitive material 16 which data has been temporarily stored in the frame memory 180. The exposure section control circuit 186 performs various corrections, and then stores the image data back in the frame memory 180 as scanning-exposure image data.

Then, the circuit 186 rotates the polygon mirror 68 of the exposure section 184 in the direction of the arrow A in FIG. 2, decides an exposure value corresponding to the density of the generated scanning-exposure image data for each of R, G, and B at every pixel, and outputs signals representing the exposure values to the corresponding pulse-width modulation circuits 56 of the exposure section 184. Thus, PWM signals corresponding to densities of the scanning-exposure image data of each of R, G, and B is input to the corresponding laser-driving circuit 58.

When the PWM signals corresponding to the densities of the scanning-exposure image data of each of R, G, and B are input to the laser-driving circuit 58, the laser-driving circuit 58 supplies a driving current corresponding to the target light amount to the LD 91A in accordance with the input PWM signals. Thus, each LD 91A repeatedly starts and stops emission in accordance with the densities of the scanning-exposure image data.

Therefore, laser beams of R, G, and B corresponding to R, G, and B densities of the image to be recorded on the photosensitive material 16 are emitted from the three LDs 91A and applied to the photosensitive material 16 via the optical systems 62, plane mirror 64, plane mirror 66, polygon mirror 68, fθ lenses 72A and 72B, cylindrical lens 74, cylindrical mirror 76, and return mirror 78.

Emission positions of the laser beams of R, G, and B from the exposure apparatus 38 are scanned along the direction of the arrow B in FIG. 2 and thus main scanning is performed, the photosensitive material 16 is carried at a constant speed along the direction of the arrow D in FIG. 1 and thus subscanning by each laser beam is performed, and an image (latent image) is recorded on the photosensitive material 16 by scanning exposure.

During the scanning exposure, the timing for modulating each laser beam and the timing for carrying the photosensitive material 16 in the direction of the arrow D in FIG. 1 are decided in accordance with sensor output signals output from the SOS-detecting sensor 82.

Next, general operations of the image recording apparatus 10 are described below.

In the image recording apparatus 10, the photosensitive material magazine 14 is set and then, the nip roller 18 is operated and the photosensitive material 16 is drawn by the nip roller 18. When the photosensitive material 16 is drawn up to the predetermined length, the cutter 20 operates to cut the photosensitive material 16 to the predetermined length, and the photosensitive material 16 cut to the predetermined length is carried to the exposure position 22 with the photosensitive (exposure) face of the photosensitive material 16 facing leftward. Then, simultaneously with the photosensitive material 16 passing through the exposure position 22, the laser beams of R, G, and B modulated in accordance with the data for the image to be recorded are emitted from the exposure apparatus 38 and the image is scanning-exposed onto the photosensitive material 16 at the exposure position 22.

When the exposure is completed, the exposed photosensitive material 16 is sent to the water-applying section 50. In the water-applying section 50, the carried photosensitive material 16 is carried into the jet tank 312 by driving of the carrying roller 32, and water is applied to the photosensitive material 16 by the water jet from the jet tank 312.

The photosensitive material 16 to which the water serving as the image-forming solvent has been applied in the water-applying section 50 is transported between the endless belts 122 and 124 of the heat-developing and transferring section 120 by the carrying roller 34.

As the image is scanning-exposed onto the photosensitive material 16, the image-receiving material 108 is drawn from the image-receiving material magazine 106 by the nip roller 110 and carried. When the image-receiving material 108 is drawn to the predetermined length, the cutter 112 operates and the image-receiving material 108 is cut to the predetermined length.

After the cutter 112 has operated, the cut image-receiving material 108 is carried by the carrying rollers 132, 134, 136, and 138 while being guided by guide plates. When the front end of the image-receiving material 108 is held by the carrying roller 138, the image-receiving material 108 enters a standby state immediately before the heat-developing and transferring section 120.

Then, as described above, the photosensitive material 16 is transported between the endless belts 122 and 124 by the carrying roller 34, and carrying of the image-receiving material 108 is resumed and the image-receiving material 108 is transported between the endless belts 122 and 124 together with the photosensitive material 16.

As a result, the photosensitive material 16 and the image-receiving material 108 are superimposed and held and carried while being heated by the heating plate 126 to form an image by performance of heat-development and transfer.

Further, when the photosensitive material 106 and the image-receiving material 108 are ejected from the endless belts 122 and 124, the separation pawl 128 engages with the front end of the photosensitive material 16, which was advanced from the image-receiving material 108 by a predetermined length, to separate the front end of the photosensitive material 16 from the image-receiving material 108. The photosensitive material 16 is further carried by the photosensitive-material ejection roller 148 and stored in the used photosensitive material storing section 150. At this time, because the photosensitive material 16 dries quickly, it is unnecessary to use more heaters for drying the photosensitive material 16.

Meanwhile, the image-receiving material 108 separated from the photosensitive material 16 is carried by the image-receiving-material ejection rollers 162, 164, 166, 168, and 170 and ejected to the tray 172.

To record a plurality of images, the above steps are sequentially continuously executed.

Thus, the image-receiving material 108 which is held by the endless belts 122 and 124 and heat-developed and transferred and on which the predetermined image is formed (recorded) is ejected from the endless belts 122 and 124, and then held and carried by the image-receiving-material ejection rollers 162, 164, 166, 168, and 170 and taken out to the outside of the apparatus.

As described above in detail, the exposure apparatus serving as the semiconductor laser driving apparatus of the first embodiment performs APC while driving the LDs in the same way as for actual optical scanning, changes temperatures of the LDs while the APC is being performed, and decides the control temperatures of the LDs for optical scanning in accordance with light amount changes due to mode-hopping noise. Therefore, it is possible to decide the control temperatures under the same conditions as for actual optical scanning, to assuredly prevent the influence of mode-hopping noise, and to perform the above APC and decision of the control temperature using various combinations of units for performing APC and ATC. Therefore, it is possible to decrease the size and cost of the apparatus.

Moreover, in the case of the image recording apparatus serving as the image-forming apparatus of the first embodiment, the temperature of the LD is controlled so as to become equal to the control temperature when forming an image. Therefore, it is possible to form a high-quality image in which the influence of mode-hopping noise is prevented.

(Second Embodiment)

For the above-described first embodiment, a case is described in which each LD has one target light amount. In a second embodiment, however, a case is described in which each LD has a plurality of target light amounts. That is, because each of types of photosensitive material on which images will be formed have different emission light amounts, an emission light amount suitable for an LD depends on the type of photosensitive material. Therefore, a control temperature, which is capable of preventing mode-hopping noise that causes visible irregularities on a formed image, for each of target light amounts suitable for the types of photosensitive material usable by the image recording apparatus 10 is set in advance. When actually forming an image and performing APC and ATC in accordance with a target light amount corresponding to the photosensitive material being used and the control temperature for that target light amount, it is possible to form a high-quality image in which no irregularities are observed, whichever photosensitive material is used.

Because the configuration of the image recording apparatus of the second embodiment is the same as that of the recording apparatus 10 of the first embodiment, description thereof is omitted. Moreover, because operations other than decision of the control temperature are the same for the image recording apparatus of the second embodiment as for the first embodiment, descriptions thereof are also omitted.

Next, decision of the control temperatures of the image recording apparatus 10 of the second embodiment is described below with reference to FIG. 12. Steps in FIG. 12 for performing processing the same as in FIG. 6 are provided with step numbers the same as in FIG. 6 and descriptions thereof are omitted.

Figure 12:
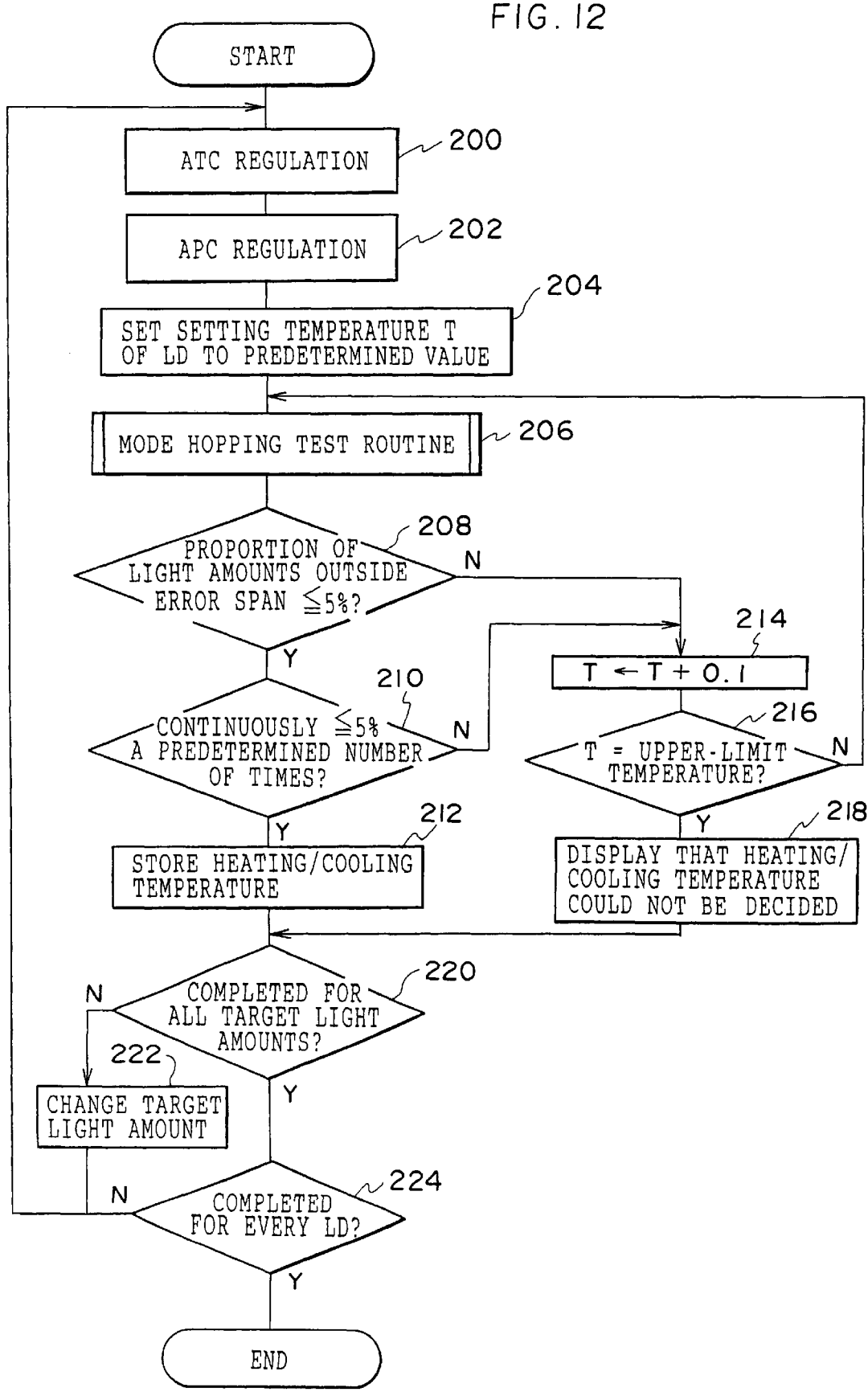
FIG. 12 is a flowchart showing a flow of control temperature decision to be executed by an exposure apparatus of a second embodiment.

As shown in FIG. 12, the control temperature decision of the second embodiment is different from the control temperature decision of the first embodiment only in that the judgement in step 220 is added immediately before step 224, and the processing in step 222, which is to be executed in accordance with a result of step 220, is added.

That is, in the image recording apparatus 10 of the second embodiment, a preferred target light amount for each usable photosensitive material is previously stored in the memory 188 and, in step 220, it is determined whether or not the processes in steps 200 to 218 are complete for every target light amount stored in the memory 188. When the processes are not completed (a negative result is obtained), step 222 is started, and selects one of remaining target light amounts as a target light amount for which a control temperature will be decided, and then control returns to step 200. When the processes have been completed for all the target light amounts (when an affirmative result is obtained in step 220), step 224 is started.

By the control temperature decision, a control temperature capable of preventing the influence of mode-hopping noise is obtained for each usable photosensitive material. Therefore, when forming an actual image, ATC is performed using the control temperature corresponding to the type of photosensitive material being used.

As described above in detail, in the case of the exposure apparatus serving as the semiconductor laser driving apparatus of the second embodiment, it is possible to obtain the same advantages as the first embodiment and prevent the influence of mode-hopping noise regardless of the type of photosensitive material, because control temperatures are decided for each of the plurality of target light amounts corresponding to types of photosensitive material.

Moreover, because the image recording apparatus serving as the image-forming apparatus of the second embodiment controls the temperature of the LDs by regulating ATC so as to make the temperature of the LD equal to the control temperature corresponding to the type of photosensitive material being used, it is possible to form a high-quality image in which the influence of mode-hopping noise is prevented regardless of the type of the photosensitive material.

For the above embodiments, a case is described in which the present invention is applied to an exposure apparatus that directly modulates a laser beam. However, the present invention is not restricted to the above case. The present invention can, of course, also be applied to an exposure apparatus that modulates a laser beam through external modulation using an AOM (acousto-optic modulation) device, an EOM (electro-optic modulation) device, or an MOM (magneto-optic modulation) device. Also, in this case, advantages the same as those of the above embodiments can be obtained.

Moreover, for the above embodiments, a case is described in which the power transistor 92 and fan 84 are used for the temperature adjusting section of the present invention. However, the present invention is not restricted to the above case. For example, a Peltier device may be used.

Figure 13:
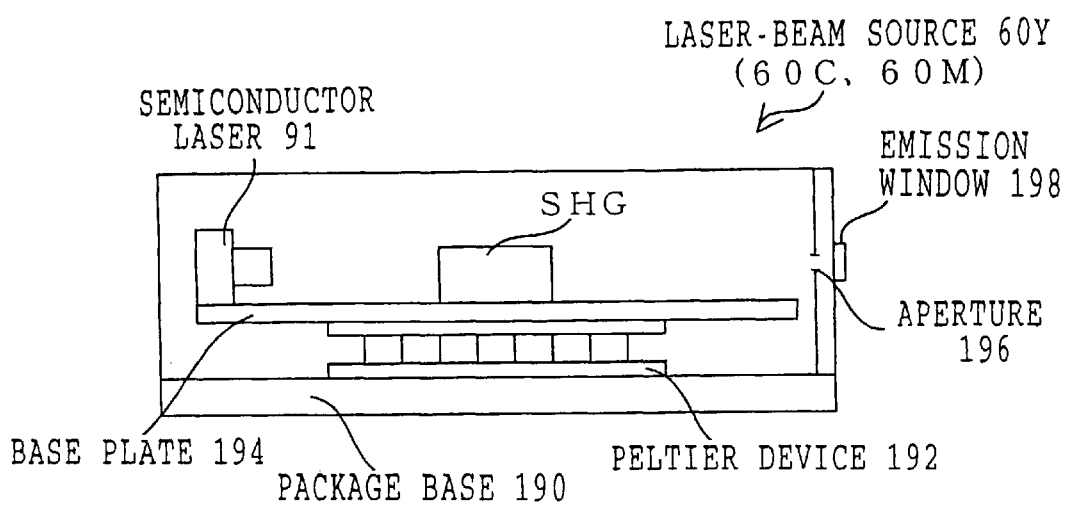
FIG. 13 is a sectional side view showing a configuration of a laser beam source when using a Peltier device as a temperature adjusting section.

FIG. 13 shows a configuration of a laser-beam source when using a Peltier device as a temperature adjusting section. In the example shown in FIG. 13, a Peltier device 192 is set on a package base 190, a base plate 194 is set on the Peltier device 192, and a semiconductor laser 91 and an SHG (wavelength conversion device) are set on the base plate 194.

The SHG converts laser light emitted from an LD into laser light having a wavelength half as long, to obtain a desired wavelength. However, the SHG can be omitted when each LD can emit a laser beam corresponding to each color, as in each of the above embodiments.

Though not illustrated, various parts including a condenser lens and a resonance mirror are also mounted on the base plate 194, in addition to the semiconductor laser 91 and SHG. Moreover, an aperture 196 and am emission window 198 are provided for the laser-beam emission position of the laser-beam source.

When using a Peltier device as the temperature adjusting section, it is possible to raise or lower the temperature of the LD 91A included in the semiconductor laser 91 simply by adjusting the value of a voltage applied to the Peltier device. Therefore, it is possible to easily and quickly adjust the temperature of the LD 91A.

Moreover, for the above embodiments, a case is described in which the PD 91B previously provided for the semiconductor laser 91 is used for the light amount detecting section of the present invention. However, the present invention is not restricted to the above case. A photoelectric-conversion device such as a PD or phototransistor may be used as the light amount detecting section separately from the PD 91B.

Furthermore, for the above embodiments, a case is described in which the control temperature decision is executed when the power switch of the image recording apparatus 10 is turned on. However, the present invention is not restricted to the above case. A configuration is also possible which performs the same processing as the above when an apparatus is shipped or which performs the same processing as the above whenever an image is formed.

Furthermore, for the above embodiments, a case is described in which control temperatures of the three LDs 91A are decided one-by-one when performing the control temperature decision. However, the present invention is not restricted to the above case. A configuration may be used which determines the control temperatures of the three LDs 91A in parallel. In this case, it is possible to perform processes such as ATC regulation and APC regulation shown in FIG. 6 simultaneously for the three LDs. Thus, it is possible to perform the control temperature decision in a shorter time compared to the case of each of the above embodiments.

Moreover, for the above embodiments, a case is described in which the image data used for the mode-hopping test is previously prepared, and to perform optical scanning is performed in accordance with the image data to simultaneously obtain a light amount for each line. However, the present invention is not restricted to the above case. It is also possible to use a configuration which prepares a fixed value as a substitute for the above image data and performs optical scanning using the fixed value as image data for each line, and simultaneously obtain a light amount for each line. In this case, because it is not necessary to previously prepare image data, it is possible to reduce storage capacity for image data.

Furthermore, for the above embodiments, a case is described in which image data for a gray image is used as the image data for the mode-hopping test. However, the present invention is not restricted to the above case. It is also possible to use image data of an image that is actually being formed. In this case, it is possible to calculate the control temperature under conditions almost the same as the conditions of actual optical scanning. Therefore, it is possible to calculate the control temperature more accurately compared to the case of each of the above embodiments.

Furthermore, for the above embodiments, a case is described in which the mode-hopping tests are finished when results of the tests are preferable. However, the present invention is not restricted to the above case. It is also possible to use a configuration that changes the setting temperature T by a predetermined temperature interval (e.g. 0.1° C.) through a predetermined temperature range, obtaining light amounts for a predetermined number of lines (e.g.

1,000 lines) for each setting temperature, and then deciding the control temperature on the basis of the light amount obtained for all the setting temperatures.

In this case, numbers of light amounts outside a tolerance range are obtained for all setting temperatures in a predetermined temperature range, as shown in FIG. 10. Thus, in the case of the example shown in FIG. 10, it is also possible to select 42.5° C. which is the central temperature in a range from 41° C. to 44° C. in which the number of light amounts outside the tolerance range is almost equal to 0 (zero), as the control temperature and thus decide on a control temperature which is more stable, that is, at which mode-hopping noise is not easily generated.

Furthermore, for the above embodiments, a case is described in which various combinations of members for ATC and APC are provided for the exposure apparatus 38 for decision of the control temperature. However, the present invention is not restricted to the above case. It is also possible to use a configuration which includes the members necessary for the control temperature decision in a jig for fabricating and inspecting an apparatus, and which determines the control temperature using this fabrication and inspection jig before the apparatus is shipped.

Furthermore, for the above embodiments, a case is described in which a plurality of light amounts are detected for each of a plurality of setting temperatures, and the setting temperature when the proportion of the light amounts outside a tolerance range is equal to or less than a predetermined proportion is used as a prospective control temperature. However, the present invention is not restricted to the above case. It is also possible to use a configuration which detects one light amount for each of a plurality of setting temperatures and decides on a setting temperature at which the detected light amount is kept in an tolerance range as a prospective control temperature. In this case, it is not necessary to detect a plurality of light amounts for each setting temperature, even though accuracy of the determined control temperature is lower compared to the case of the above embodiments. Thus, it is possible to reduce the time required to decide the control temperature.

What is claimed is:

1. A semiconductor laser driving apparatus that drives a semiconductor laser that emits laser light for optical scanning, the apparatus comprising:

a light amount detecting section which detects a light amount of a laser light emitted from the semiconductor laser;

a temperature detecting section which detects a laser section temperature, which is one of a temperature of a light-emitting section of the semiconductor laser and a temperature of a vicinity of the semiconductor laser;

a temperature adjusting section which adjusts the laser section temperature;

a light amount control section which, while the semiconductor laser is driven in a manner the same as for actual optical scanning, controls driving of the semiconductor laser such that a light amount detected by the light amount detecting section becomes equal to a predetermined target light amount; and a temperature deciding section that, while control is performed by the light amount control section, causes the laser section temperature to be altered by the temperature adjusting section, and, if a light amount detected by the light amount detecting section is within a predetermined error span, decides on the laser section temperature as a setting temperature for optical scanning of the semiconductor laser.

2. The semiconductor laser driving apparatus according to claim 1, wherein, in a case in which the optical scanning is optical scanning for forming an image on the basis of optical data, while the semiconductor laser is driven such that an image can be formed in accordance with predetermined image data, the light amount control section controls the light amount of the semiconductor laser such that the light amount becomes equal to the target light amount, and the temperature deciding section causes the laser section temperature to be altered, and decides, as the setting temperature for the optical scanning of the semiconductor laser, a laser section temperature level at which an error proportion is at most a predetermined proportion, the error proportion being a ratio of
a number of image line light amounts, among a plurality of image line light amounts which are detected by the light amount detecting section at each temperature level, that are outside the predetermined error span, to
a total number of lines.

3. The semiconductor laser driving apparatus according to claim 2, wherein, when a range of the laser section temperature, in which range the error proportion is at most the predetermined proportion, is broader than a predetermined range, the temperature deciding section decides on one of a temperature at a middle of the range and a temperature near the middle of the range as the setting temperature.

4. The semiconductor laser driving apparatus according to claim 2, wherein the temperature deciding section decides, as the setting temperature, a laser section temperature level at which the error proportion is at most the predetermined proportion, the laser section temperature level differing from another laser section temperature level, at which the error proportion is more than the predetermined proportion, by more than a predetermined temperature difference.

5. The semiconductor laser driving apparatus according to claim 1, wherein control by the light amount control section and decision of the setting temperature by the temperature deciding section are performed for a plurality of target light amounts.

6. The semiconductor laser driving apparatus according to claim 1, wherein control by the light amount control section and decision of the setting temperature by the temperature deciding section are performed for a plurality of semiconductor lasers which emit laser light at different wavelengths.

7. A semiconductor laser driving method that drives a semiconductor laser that emits laser light for optical scanning, the method comprising the steps of:

(A) controlling driving of the semiconductor laser such that, while the semiconductor laser is driven in a manner the same as for actual optical scanning, a light amount of the laser light emitted from the semiconductor laser becomes equal to a predetermined target light amount; and (B) deciding a setting temperature for optical scanning of the semiconductor laser by, during the step of controlling driving, altering temperature of one of a light-emitting section of the semiconductor laser and a vicinity of the semiconductor laser, and deciding, as the setting temperature, a temperature of the one of the light-emitting section of the semiconductor laser and the vicinity of the semiconductor laser at which temperature the light amount of the laser light is within a predetermined error span.

8. An image-forming apparatus comprising:
a semiconductor laser driving apparatus for driving a semiconductor laser, said semiconductor laser driving apparatus comprising:
- a light amount detecting section which detects a light amount of a laser light emitted from the semiconductor laser;
- a temperature detecting section which detects a laser section temperature, which is one of a temperature of a light-emitting section of the semiconductor laser and a temperature of a vicinity of the semiconductor laser;
- a temperature adjusting section which adjusts the laser section temperature;
- a light amount control section which, while the semiconductor laser is driven in a manner the same as for actual optical scanning, controls driving of the semiconductor laser such that a light amount detected by the light amount detecting section becomes equal to a predetermined target light amount;
- a temperature deciding section that, while control is performed by the light amount control section, causes the laser section temperature to be altered by the temperature adjusting section, and, if a light amount detected by the light amount detecting section is within a predetermined error span, decides on the laser section temperature as a setting temperature for optical scanning of the semiconductor laser;
- a temperature control section which controls the temperature adjusting section such that a temperature detected by the temperature detecting section becomes equal to the setting temperature decided by the temperature deciding section; and
- a recording medium at which an image is formed by laser light emitted from the semiconductor laser.

9. The semiconductor laser driving apparatus according to claim 1 wherein said predetermined error span between −0.5% and +0.5% of the target light amount.

10. The semiconductor laser driving apparatus according to claim 1 wherein said setting temperature is within 0.5° C. of the laser section temperature decided by the temperature deciding section.

* * * * *